(12) United States Patent
Kwon

(10) Patent No.: US 11,741,347 B2
(45) Date of Patent: Aug. 29, 2023

(54) NON-VOLATILE MEMORY DEVICE INCLUDING ARITHMETIC CIRCUITRY FOR NEURAL NETWORK PROCESSING AND NEURAL NETWORK SYSTEM INCLUDING THE SAME

(71) Applicant: Samsung Electronics Co., Ltd., Suwon-si (KR)

(72) Inventor: Joon-soo Kwon, Seoul (KR)

(73) Assignee: SAMSUNG ELECTRONICS CO., LTD.

(*) Notice: Subject to any disclaimer, the term of this patent is extended or adjusted under 35 U.S.C. 154(b) by 993 days.

(21) Appl. No.: 16/507,493

(22) Filed: Jul. 10, 2019

(65) Prior Publication Data

US 2020/0193277 A1    Jun. 18, 2020

(30) Foreign Application Priority Data

Dec. 18, 2018 (KR) .......................... 10-2018-0164305

(51) Int. Cl.
*G06N 3/063* (2023.01)
*G06F 7/544* (2006.01)
*G11C 16/26* (2006.01)
*G06F 7/57* (2006.01)
*G06N 3/045* (2023.01)

(52) U.S. Cl.
CPC .......... *G06N 3/063* (2013.01); *G06F 7/5443* (2013.01); *G06F 7/57* (2013.01); *G11C 16/26* (2013.01); *G06N 3/045* (2023.01)

(58) Field of Classification Search
CPC ......... G11C 16/26; G06F 7/5443; G06F 7/57; G06F 9/3001; G06N 3/0454; G06N 3/063
See application file for complete search history.

(56) References Cited

U.S. PATENT DOCUMENTS

| | | | | |
|---|---|---|---|---|
| 5,278,781 A | * | 1/1994 | Aono | .................... G06F 7/5443 |
| | | | | 708/402 |
| 5,875,439 A | * | 2/1999 | Engel | .................. G06N 3/0445 |
| | | | | 706/41 |
| 7,075,810 B2 | | 7/2006 | Kang | |

(Continued)

FOREIGN PATENT DOCUMENTS

JP     08-031168 A     2/1996

OTHER PUBLICATIONS

Burr, et al., Neuromorphic computing using non-volatile memory, 2016, Information UK Limited, trading as Taylor & Francis Group (Year: 2016).*

(Continued)

*Primary Examiner* — Vincent Gonzales
(74) *Attorney, Agent, or Firm* — Fish & Richardson P.C.

(57) ABSTRACT

A non-volatile memory device includes a memory cell array to which an arithmetic internal data is written; and an arithmetic circuitry configured to receive an arithmetic input data and the arithmetic internal data for an arithmetic operation of a neural network with the arithmetic internal data and the arithmetic input data in response to an arithmetic command, perform the arithmetic operation using the arithmetic internal data and the arithmetic input data to generate an arithmetic result data, and output the arithmetic result data of the arithmetic operation of the neural network.

17 Claims, 15 Drawing Sheets

(56) References Cited

U.S. PATENT DOCUMENTS

| | | | |
|---|---|---|---|
| 8,645,636 B2* | 2/2014 | Jaquette | G06F 3/0622 |
| | | | 711/100 |
| 8,854,883 B2* | 10/2014 | Takashima | G11C 16/04 |
| | | | 365/185.08 |
| 9,569,371 B2* | 2/2017 | Choi | G06F 12/1408 |
| 9,685,206 B2* | 6/2017 | Choi | G11C 16/26 |
| 2014/0022853 A1 | 1/2014 | Choi et al. | |
| 2015/0113204 A1 | 4/2015 | Wong et al. | |
| 2015/0228346 A1* | 8/2015 | Choi | G11C 16/16 |
| | | | 365/185.29 |
| 2016/0042803 A1* | 2/2016 | Kwon | G11C 11/5671 |
| | | | 365/185.03 |
| 2018/0075339 A1* | 3/2018 | Ma | G06N 3/084 |
| 2018/0113649 A1* | 4/2018 | Shafiee Ardestani | |
| | | | G11C 13/0002 |
| 2018/0232508 A1* | 8/2018 | Kursun | G06N 7/02 |
| 2018/0260334 A1 | 9/2018 | Asano et al. | |
| 2018/0261296 A1 | 9/2018 | Choi et al. | |
| 2018/0285104 A1* | 10/2018 | Kim | G06F 9/544 |

OTHER PUBLICATIONS

Deguchi et al., 3D-NAND Flash Solid-State Drive (SSD) for Deep Neural Network Weight Storage of IoT Edge Devices with 700x Data-retention Lifetime Extention, 2018, IEEE (Year: 2018).*

* cited by examiner

NON-VOLATILE MEMORY DEVICE INCLUDING ARITHMETIC CIRCUITRY FOR NEURAL NETWORK PROCESSING AND NEURAL NETWORK SYSTEM INCLUDING THE SAME

CROSS-REFERENCE TO RELATED APPLICATION

The present application claims the benefit of Korean Patent Application No. 10-2018-0164305, filed on Dec. 18, 2018, in the Korean Intellectual Property Office, the disclosure of which is incorporated herein in its entirety by reference.

BACKGROUND

The present disclosure relates to arithmetic processing in neural network systems and/or models.

Semiconductor memory devices may be categorized as either volatile memory devices configured to lose stored data when power supply is interrupted, or non-volatile memory devices configured to retain stored data even if a power supply is interrupted. Non-volatile memory devices may include read-only memory (ROM), programmable ROM (PROM), erasable PROM (EPROM), electrically erasable PROM (EEPROM), flash memory device, phase-change random access memory (PRAM), magnetic RAM (MRAM), resistive RAM (RRAM), and ferroelectric RAM (FRAM). A flash memory device may be broadly classified into a NOR type and a NAND type.

A neural network refers to a computational architecture that is modeled on a biological brain. Recently, as neural network technology has developed, intensive research has been conducted into techniques of analyzing input data and extracting valid information by applying a neural network device using at least one neural network model to various kinds of electronic systems.

SUMMARY

Some example embodiments may include a non-volatile memory device that includes a memory cell array to which an arithmetic internal data is written, and arithmetic circuitry configured to receive an arithmetic input data and the arithmetic internal data for an arithmetic operation of a neural network with the arithmetic internal data and the arithmetic input data in response to an arithmetic command, perform the arithmetic operation of the neural network using the arithmetic internal data and the arithmetic input data to generate an arithmetic result data, and output the arithmetic result data of the arithmetic operation of the neural network.

Some example embodiments may include a non-volatile memory device including a memory cell array to which arithmetic internal data is written, arithmetic circuitry configured to perform an arithmetic operation using a plurality of operands to generate an arithmetic result data, and control logic circuitry configured to receive an arithmetic command for the arithmetic operation for processing a neural network, read the arithmetic internal data written to a memory cell array in response to the arithmetic command, generate an arithmetic control signal that causes the arithmetic circuitry to perform the arithmetic operation for processing the neural network using the plurality of operands including the arithmetic internal data and an arithmetic input data, and output the arithmetic result data of the arithmetic operation of the neural network.

Some example embodiments may include a neural network system configured to perform an arithmetic operation of a neural network, where the neural network system includes a memory controller configured to generate an arithmetic command to perform the arithmetic operation, and transmit the arithmetic command and an arithmetic input data, and a memory device configured to receive the arithmetic command and the arithmetic input data, read an arithmetic internal data written to a memory cell array in response to the arithmetic command, perform the arithmetic operation using the arithmetic input data and arithmetic internal data, and output an arithmetic result data of the arithmetic operation of the neural network.

BRIEF DESCRIPTION OF THE DRAWINGS

Some example embodiments of some inventive concepts may more clearly understood from the following detailed description taken in conjunction with the accompanying drawings in which.

DETAILED DESCRIPTION

Hereinafter, some example embodiments of some inventive concepts are described in detail with reference to the attached drawings.

Figure 1:
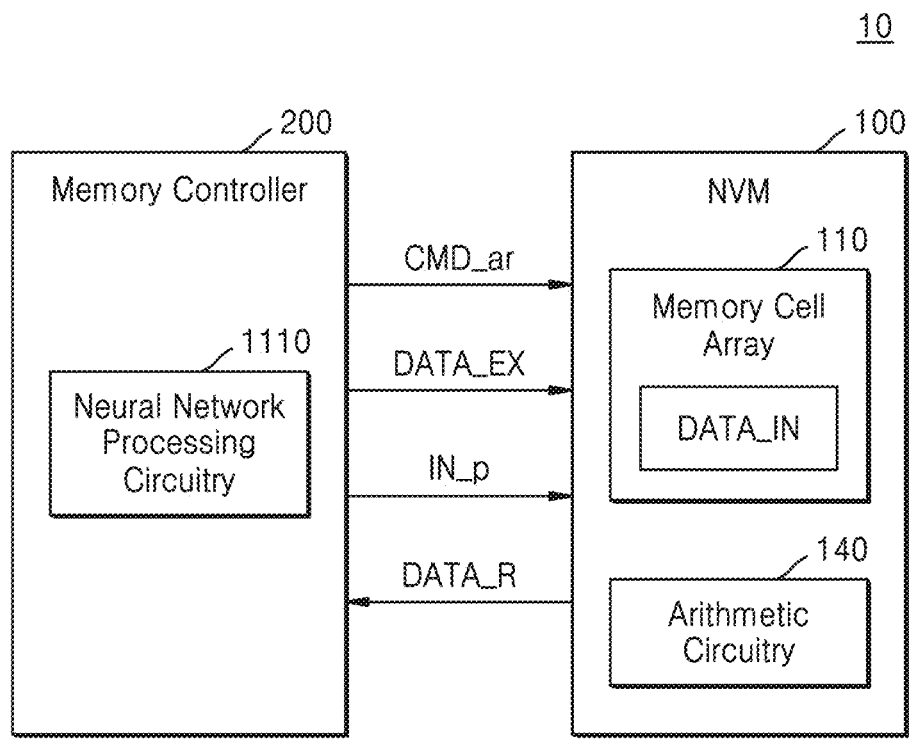
FIG. 1 is a block diagram of a memory system according to some example embodiments.

FIG. 1 is a block diagram of a memory system 10 according to an example embodiment.

Referring to FIG. 1, the memory system 10 may include a non-volatile memory device 100 and a memory controller 200. In some example embodiments, the memory system 10 may be implemented as an internal memory embedded in an electronic device and/or an external memory that is detachably attached to an electronic device. In some example embodiments, the memory system 10 may include, for example, a universal flash storage (UFS) memory card, a compact flash (CF) memory card, a secure digital (SD) memory card, a micro-SD memory card, a mini-SD memory card, an extreme Digital (xD) memory card, or a memory stick. For example, the memory system 10 may be applied to a robot device (e.g., a drone and/or an advanced drivers assistance system (ADAS)), a smart TV, a smartphone, a medical device, a mobile device, an image display device, a measuring device, and/or an Internet of Things (IoT) device. In addition, the memory system 10 may be mounted on one of various kinds of electronic devices.

In some example embodiments, the memory system 10 may include a neural network model. The memory controller 200 may include a neural network processing circuitry 1110. The memory system 10, including the neural network processing circuitry 1110, may generate a neural network, train (or learn) the neural network, perform an arithmetic operation of a neural network based on received input data, generate an information signal based on a result of the arithmetic operation of a neural network, and/or retrain the neural network. The neural network may include various kinds of processing models, such as convolution neural network (CNN) (e.g., GoogleNet, AlexNet, and/or visual geometry group (VGG) network), region with convolution neural network (R-CNN), region proposal network (RPN), recurrent neural network (RNN), stacking-based deep neural network (S-DNN), state-space dynamic neural network (S-SDNN), deconvolution network, deep belief network (DBN), restricted Boltzmann machine (RBM), fully convolutional network, long short-term memory (LSTM) network, and/or classification network, but are not limited thereto. The neural network may include, may be supplemented by, and/or may operate in conjunction with a variety of other processing models, such as Bayesian statistical classifiers, genetically evolved algorithms, fuzzy logic systems, and/or rule-based and/or heuristic classifiers such as decision trees, including combinations thereof.

In some example embodiments, a memory controller 200 may control the non-volatile memory device 100 to read data stored in the non-volatile memory device 100 and/or write data to the non-volatile memory device 100 in response to a read/write request from a host. The memory controller 200 may provide a command, an address, and/or a control signal to the non-volatile memory device 100 and/or may control write, read, erase, and/or arithmetic operations of a neural network involving the non-volatile memory device 100. Data may be transmitted and/or received between the memory controller 200 and the non-volatile memory device 100.

In some example embodiments, the memory controller 200 may provide an arithmetic command CMD_ar and/or arithmetic input data DATA_EX to the non-volatile memory device 100 so that the non-volatile memory device 100 may perform an arithmetic operation of a neural network. In this case, to read arithmetic internal data DATA_IN written to a memory cell array 110, the memory controller 200 may further provide an arithmetic information signal IN_p to the non-volatile memory device 100. In some example embodiments, the memory controller 200 may provide the arithmetic command CMD_ar and/or the arithmetic input data DATA_EX to the non-volatile memory device 100 through a line through which a write command and/or a read command for a write operation and/or a read operation of the non-volatile memory device 100 are transmitted.

In some example embodiments, the arithmetic information signal IN_p may include an address for indicating a memory location where the arithmetic internal data DATA_IN is written and/or accessible. In some example embodiments, the arithmetic information signal IN_p may include information about addresses of a plurality of pages in which the arithmetic internal data DATA_IN is stored. In some example embodiments, the arithmetic information signal IN_p may include information about an address of a page on which an initial read operation is to be performed, from among the plurality of pages in which the arithmetic internal data DATA_IN is stored. An arithmetic information signal IN_p may include information about a number of memory pages over which the arithmetic internal data DATA_IN is stored.

The non-volatile memory device 100 may be implemented as a non-volatile memory circuit. The non-volatile memory device 100 may include the memory cell array 110 and arithmetic circuitry 140. The non-volatile memory device 100 may perform an arithmetic operation of a neural network in response to the arithmetic command CMD_ar. The operation of the non-volatile memory device 100 may broadly include one or more of an operation of reading the arithmetic internal data DATA_IN, an operation of receiving the arithmetic input data DATA_EX, an arithmetic operation of a neural network using the arithmetic internal data DATA_IN and/or the arithmetic input data DATA_EX, and/or an operation of outputting arithmetic result data DATA_R.

The memory cell array 110 may include a plurality of memory blocks, each of which may include a plurality of pages. In some example embodiments, each of the memory blocks may independently perform an erase operation, and/or each of the pages may independently perform a read operation. The memory cell array 110 may include a plurality of memory cells. For example, the plurality of memory cells may be flash memory cells. Hereinafter, some example embodiments are described in detail in which a plurality of memory cells may include NAND flash memory cells. In other example embodiments, the plurality of memory cells may be resistive memory cells, such as resistive RAM (RRAM) cells, phase-change RAM (PRAM) cells, or magnetic RAM (MRAM) cells.

In some example embodiments, the arithmetic circuitry 140 may perform arithmetic operations according to models of the neural network. For example, the arithmetic circuitry 140 may perform arithmetic operations of a neural network using a plurality of operands. In some example embodiments, the plurality of operands may include arithmetic input data DATA_EX provided by the memory controller 200 and/or the arithmetic internal data DATA_IN written to the memory cell array 110. In some example embodiments, when arithmetic command CMD_ar is received, the non-volatile memory device 100 may read arithmetic internal data DATA_IN from the memory cell array 110 and/or may perform an arithmetic operation of a neural network using the externally received arithmetic input data DATA_EX and/or the read arithmetic internal data DATA_IN. The arithmetic circuitry 140 may perform the arithmetic operation of a neural network using the plurality of operands, may generate arithmetic result data DATA_R, and/or may provide the arithmetic result data DATA_R to the memory controller 200.

In some example embodiments, the arithmetic circuitry 140 may perform all or part of a convolution arithmetic operation of a neural network. To this end, the arithmetic circuitry 140 may include multiplication and accumulation circuitry (MAC) configured to perform a multiplication operation and an addition operation, such as described with reference to FIG. 9. In some example embodiments, the arithmetic circuitry 140 may include a plurality of MACs, which are connected in a ring form. In some example embodiments, the arithmetic circuitry 140 may further include a non-linear function processor and/or a quantizer.

The non-volatile memory device 100 of the memory system 10 according to some example embodiments may perform an operation of reading the arithmetic internal data DATA_IN and/or an operation of receiving the arithmetic input data DATA_EX in parallel. In addition, during an arithmetic operation of a neural network using the arithmetic internal data DATA_IN and/or the arithmetic input data DATA_EX, an operation of reading a next arithmetic internal data DATA_IN for a next arithmetic operation of the neural network and/or an operation of receiving a next arithmetic input data DATA_EX for a next arithmetic operation of the neural network may be performed in parallel. Accordingly, the time taken to perform the arithmetic operation of a neural network on the arithmetic internal data DATA_IN and/or the arithmetic input data DATA_EX may be reduced, such that an arithmetic operation speed, and therefore a processing speed of a neural network, may be increased. In the present disclosure, performing different operations in parallel may mean that there is a section in which the different operations are simultaneously performed.

In contrast to a memory system of the related art in which only the memory controller 200 performs the arithmetic operation of a neural network, the non-volatile memory device 100 according to some inventive concepts may previously perform the arithmetic operation of a neural network and then provide arithmetic result DATA_R to the memory controller 200. Thus, the efficiency of the arithmetic operation of the memory system 10 may be increased, thereby promoting the performance of the memory system 10 and, consequently, the processing of the neural network.

Figure 2:
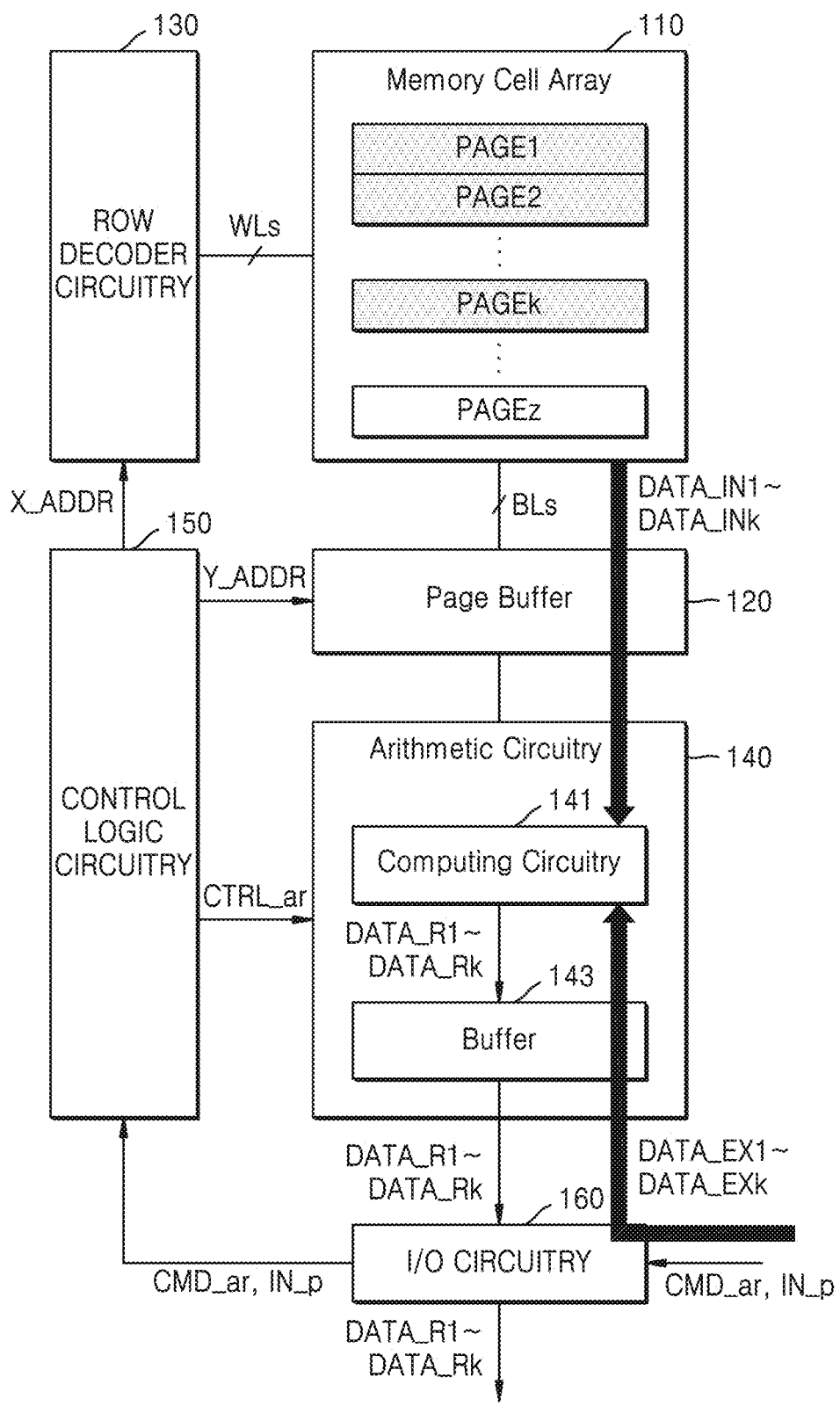
FIG. 2 is a detailed block diagram of a non-volatile memory device of FIG. 1, according to some example embodiments.

FIG. 2 is a detailed block diagram of the non-volatile memory device 100 of FIG. 1, according to some example embodiments.

Referring to FIG. 2, the non-volatile memory device 100 may include a memory cell array 110, a page buffer 120, row decoder circuitry 130, arithmetic circuitry 140, control logic circuitry 150, and/or input/output (I/O) circuitry 160. The arithmetic circuitry 140 may include computing circuitry 141 and/or a buffer 143.

The memory cell array 110 may be connected to the page buffer 120 through bit lines BLs and connected to the row decoder circuitry 130 through word lines WLs. The memory cell array 110 may include a plurality of memory blocks and a plurality of pages PAGE1 to PAGEz. The non-volatile memory device 100 may perform a read operation or a write operation in units of pages. In some example embodiments, the non-volatile memory device 100 may perform an arithmetic operation of a neural network in units of pages. Each of the memory cells included in the memory cell array 110 may store at least one bit. Each of the memory cells may include a single-level cell (SLC), a multi-level cell (MLC), a triple-level cell (TLC), or a quadruple-level cell (QLC).

The page buffer 120 may select some bit lines out of the bit lines BLs in response to a column address Y-ADDR provided by the control logic circuitry 150. For example, the page buffer 120 may operate as a write driver or a sense amplifier according to an operation mode (e.g., a write mode or a read mode). In some example embodiments, the page buffer 120 may operate as a sense amplifier configured to read first to k-th arithmetic internal data DATA_IN1 to DATA_INk from the memory cell array 110 to perform an arithmetic operation of a neural network. Each of the first to k-th arithmetic internal data DATA_IN1 to DATA_INk may be the arithmetic internal data DATA_IN of FIG. 1.

The row decoder circuitry 130 may select at least one word line out of the word lines WLs in response to a row address X-ADDR provided by the control logic circuitry 150. A set of memory cells connected to a selected word line may be interpreted as a selected page. In some example embodiments, the row decoder circuitry 130 may sequentially select first to k-th pages PAGE1 to PAGEk to read the first to k-th arithmetic internal data DATA to DATA_INk for the arithmetic operation of a neural network, and/or the first arithmetic internal data DATA_IN1 written to the first page PAGE1 to the k-th arithmetic internal data DATA_INk written to the k-th page PAGEk may be sequentially read. In some example embodiments, the first to k-th pages PAGE1 to PAGEk may have consecutive addresses, but some example embodiments of some inventive concepts may not be limited thereto.

The computing circuitry 141 of the arithmetic circuitry 140 may perform an arithmetic operation of a neural network using a plurality of operands in response to an arithmetic control signal CTRL_ar provided by the control logic circuitry 150. At least one of the plurality of operands may be the first to k-th arithmetic internal data DATA_IN1 to DATA_INk provided by the page buffer 120. Also, at least one of the plurality of operands may be first to k-th arithmetic input data DATA_EX1 to DATA_EXk, which may be received by the non-volatile memory device 100. Each of the first to k-th arithmetic input data DATA_EX1 to DATA_EXk may be the arithmetic input data DATA_EX of FIG. 1.

In some example embodiments, the computing circuitry 141 may perform arithmetic operations of a neural network using the first to k-th arithmetic internal data DATA_IN1 to DATA_INk and/or the first to k-th arithmetic input data DATA_EX1 to DATA_EXk in response to the arithmetic control signal CTRL_ar. For example, the computing circuitry 141 may perform a first arithmetic operation of a neural network using the first arithmetic internal data DATA_IN1 and/or the first arithmetic input data DATA_EX1 and/or perform a k-th arithmetic operation of a neural network using the k-th arithmetic internal data DATA_INk and/or the k-th arithmetic input data DATA_EXk. The computing circuitry 141 may sequentially perform the first to k-th arithmetic operations of a neural network in response to the arithmetic control signal CTRL_ar and/or generate, sequentially and/or in parallel, first to k-th arithmetic result data DATA_R1 to DATA_Rk as respective results of the first to k-th arithmetic operations of a neural network. The computing circuitry 141 may sequentially output the first to k-th arithmetic result data DATA_R1 to DATA_Rk to the buffer 143. Each of the first to k-th arithmetic result data DATA_R1 to DATA_Rk may be the arithmetic result data DATA_R of FIG. 1.

In some example embodiments, an arithmetic operation of a neural network that is performed by the computing circuitry 141 may include all or part of a convolution operation. For example, arithmetic internal data DATA_IN may be input feature data included in an input feature map 401 of FIG. 8A, and/or arithmetic input data DATA_EX may be kernel data included in a kernel 402 of FIG. 8A. An example of a convolution operation is described below with reference to FIG. 8A.

The buffer 143 of the arithmetic circuitry 140 may temporarily store the first to k-th arithmetic result data DATA_R1 to DATA_Rk. In response to the arithmetic control signal CTRL_ar provided by the control logic circuitry 150, the buffer 143 may provide the stored first to k-th arithmetic result data DATA_R1 to DATA_Rk through the I/O circuitry 160 (e.g., the memory controller 200 of FIG. 1) of the non-volatile memory device 100. In some example embodiments, the buffer 143 may sequentially output the first to k-th arithmetic result data DATA_R1 to DATA_Rk to I/O circuitry 160 in response to the arithmetic control signal CTRL_ar.

The control logic circuitry 150 may control the overall operation of the non-volatile memory device 100. In some example embodiments, the control logic circuitry 150 may cause the arithmetic circuitry 140 to perform an arithmetic operation of a neural network in response to an arithmetic command CMD_ar and/or an arithmetic information signal IN_p, which are received through the I/O circuitry 160 from the memory controller 200. For example, in response to the arithmetic command CMD_ar and/or the arithmetic information signal IN_p, the control logic circuitry 150 may output various control signals to cause the arithmetic circuitry 140 to perform one or more arithmetic operations of a neural network, for example, a column address Y-ADDR, a row address X-ADDR, and/or an arithmetic control signal CTRL_ar.

In some example embodiments, the arithmetic information signal IN_p may include addresses for respectively indicating first to k-th pages PAGE1 to PAGEk to which the first to k-th arithmetic internal data DATA to DATA_INk are respectively written. Accordingly, the control logic circuitry 150 may provide the row address X-ADDR to the row decoder circuitry 130 in response to the arithmetic information signal IN_p. In some example embodiments, the arithmetic information signal IN_p may include an address indicating the first page PAGE1 to which the first arithmetic internal data DATA_IN1 on which the first arithmetic operation of a neural network is to be performed is written, and/or information about a value k, which is the number of pages to be read. The control logic circuitry 150 may output the row address X-ADDR to the row decoder circuitry 130 in response to the arithmetic information signal IN_p.

Figure 3:
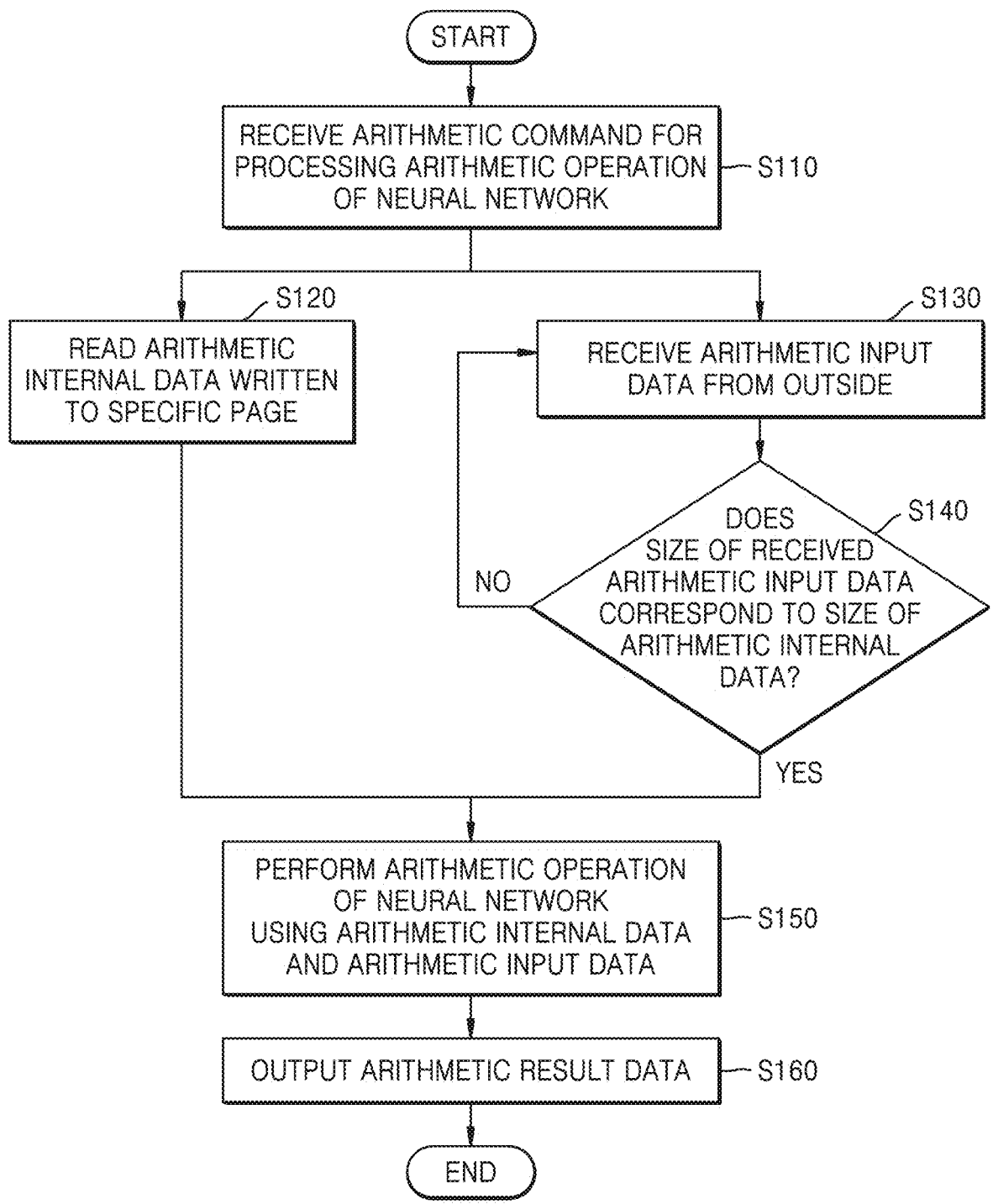
FIG. 3 is a flowchart of a method of operating a non-volatile memory device according to some example embodiments.

FIG. 3 is a flowchart of a method of operating a non-volatile memory device 100 according to some example embodiments. A first arithmetic operation of a neural network using first arithmetic internal data DATA_IN1 and/or first arithmetic input data DATA_EX1 are described as examples with reference to FIG. 3, but some example embodiments of some inventive concepts may not be limited thereto. For example, some example embodiments of some inventive concepts may be applied to a k-th arithmetic operation of a neural network using k-th arithmetic internal data DATA_INk and/or k-th arithmetic input data DATA_EXk.

Referring to FIGS. 2 and 3, in operation S110, the non-volatile memory device 100 may receive an arithmetic command CMD_ar. In operation S120, the non-volatile memory device 100 may read arithmetic internal data written to a specific page in response to the arithmetic command CMD_ar. For example, the non-volatile memory device 100 may read the first arithmetic internal data DATA_IN1 written to the first page PAGE1. On condition of completion of the operation of reading the first arithmetic internal data DATA_IN1, the non-volatile memory device 100 may read second arithmetic internal data DATA_IN2 written to a second page PAGE2.

In operation S130, the non-volatile memory device 100 may receive arithmetic input data. In operation S140, the non-volatile memory device 100 may confirm whether a size of the received arithmetic input data corresponds to a size of arithmetic internal data corresponding thereto. In some example embodiments, the non-volatile memory device 100 may confirm whether the size of the received arithmetic input data corresponds to a size of a page of the memory cell array 110. For example, when operation S130 begins, the non-volatile memory device 100 may start receiving the first arithmetic input data DATA_EX1. In operation S140, prior to performing the first arithmetic operation of a neural network, the non-volatile memory device 100 may confirm whether all of the first arithmetic input data DATA_EX1 has been received, that is, whether a size of the first arithmetic input data DATA_EX1 corresponds to a size of a page of the memory cell array 110, which may be the size of the first arithmetic internal data DATA_IN1.

In some example embodiments, an arithmetic operation of a neural network may involve the arithmetic internal data and the arithmetic input data, as operands of the arithmetic operation, that are of the same or similar sizes, types, and/or formats. Accordingly, after receiving the arithmetic input data, the non-volatile memory device 100 may confirm whether the arithmetic input data has been received by such a sufficient size as to perform the arithmetic operation of a neural network. If the size of the arithmetic input data satisfies a condition for performing the arithmetic operation of a neural network, the control logic circuitry 150 may transmit an arithmetic control signal CTRL_ar to the arithmetic circuitry 140, and operation S150 of the neural network may be performed.

In some example embodiments, the non-volatile memory device 100 may perform operation S120 and operation S130, in parallel. Some example embodiments of some inventive concepts may not be limited thereto, the non-volatile memory device 100 may perform operation S120 and operation S130 in series, partly in series and partly in parallel, etc. That is, an operation of reading first to k-th arithmetic internal data DATA_IN1 to DATA_INk and an operation of receiving first to k-th arithmetic input data DATA_EX1 to DATA_EXk may be performed in series, in parallel, partly in series and partly in parallel, etc. For example, the operation of reading the first arithmetic internal data DATA_IN1 and the operation of receiving the first arithmetic input data DATA_EX1 may be performed in series, in parallel, partly in series and partly in parallel, etc.

In operation S150, the non-volatile memory device 100 may perform an arithmetic operation of a neural network using arithmetic internal data and/or arithmetic input data, which correspond to each other. For example, the non-volatile memory device 100 may perform the first arithmetic operation of a neural network using the first arithmetic internal data DATA_IN1 and/or the first arithmetic input data DATA_EX1.

In this case, during operation S150 of performing the arithmetic operation of a neural network using arithmetic internal data and/or arithmetic input data corresponding to the arithmetic internal data, the non-volatile memory device 100 may perform operation S120 of reading other arithmetic internal data and/or operation S130 of receiving other arithmetic input data in series, in parallel, partly in series and partly in parallel, etc. In some example embodiments, during operation S150 of performing the first arithmetic operation of a neural network using the first arithmetic internal data DATA_IN1 and/or the first arithmetic input data DATA_EX1, the non-volatile memory device 100 may perform operation S120 of reading the second arithmetic internal data DATA_IN2 in series, in parallel, partly in series and partly in parallel, etc. Some example embodiments may perform operation S130 of receiving second arithmetic input data DATA_EX2 in series, in parallel, partly in series and partly in parallel, etc. Accordingly, the times taken for the non-volatile memory device 100 according to some example embodiments of some inventive concepts to sequentially and/or concurrently perform a plurality of arithmetic operations of a neural network (e.g., first to k-th arithmetic operations of a neural network) and output respective arithmetic result data (e.g., first to k-th arithmetic result data DATA_R1 to DATA_Rk) obtained by performing the plurality of arithmetic operations of a neural network to a memory controller may be reduced.

In operation S160, the non-volatile memory device 100 may output arithmetic result data, which is generated as a result of the arithmetic operation of a neural network. The arithmetic result data may be provided to the memory controller. For example, when the non-volatile memory device 100 performs the first arithmetic operation of a neural network, the non-volatile memory device 100 may transmit the first arithmetic result data DATA_R1 to the memory controller.

Figure 4:
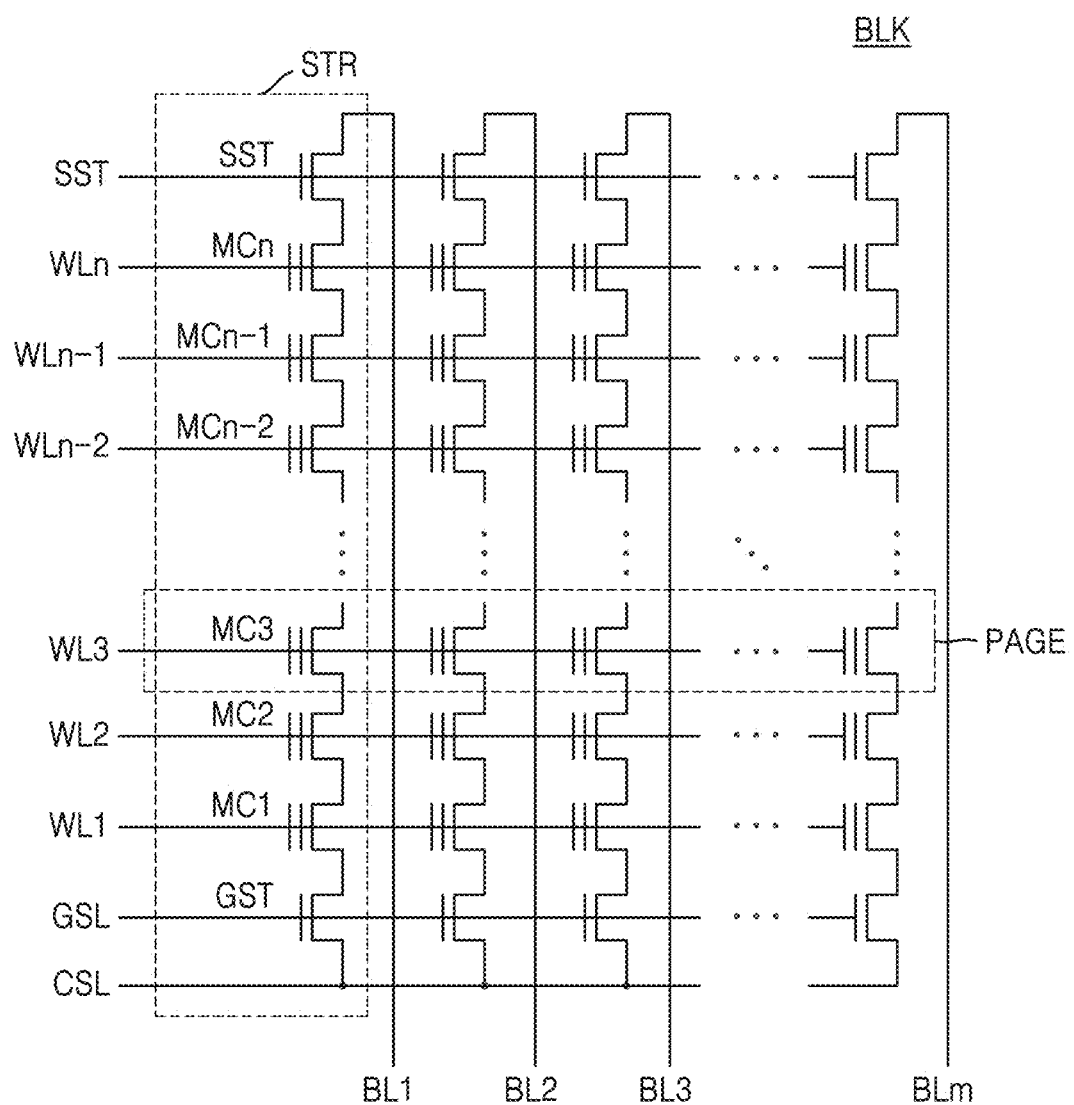
FIG. 4 is a circuit diagram of a memory block included in a memory cell array according to some example embodiments.

FIG. 4 is a circuit diagram of a memory block BLK included in a memory cell array according to some example embodiments.

Referring to FIG. 4, the memory cell array (e.g., 110 in FIG. 2) may include a memory cell array of a horizontal NAND flash memory and/or a plurality of memory blocks BLK. Each of the memory blocks BLK may include m cell strings STR, each of which includes a plurality of memory cells connected in series with respective bit lines BL1 to BLm (here, m is an integer equal to or more than 2). As an example, FIG. 4 illustrates a case in which each of the cell strings STR includes n memory cells MC1 to MCn.

A NAND flash non-volatile memory device having a structure shown in FIG. 4 may perform an erase operation in units of blocks and/or may perform a read operation and/or an arithmetic operation of a neural network in units of pages PAGE corresponding to each of word lines WL1 to WLn. FIG. 4 illustrates an example in which one block includes n pages respectively corresponding to n word lines WL1 to WLn. A non-volatile memory device (e.g., 100 in FIGS. 1 and/or 2) may drive a selected word line connected to a memory cell on which a read operation is to be performed during an arithmetic operation of a neural network. In some example embodiments, when a read operation is performed on a third memory cell MC3, a third word line WL3 may be the selected word line. The non-volatile memory device 100 shown in FIGS. 1 and/or 2 may include a plurality of memory cell arrays, which may have the same or similar structure and/or may perform the same or similar operation as the memory cell array 110 described above.

Figure 5:
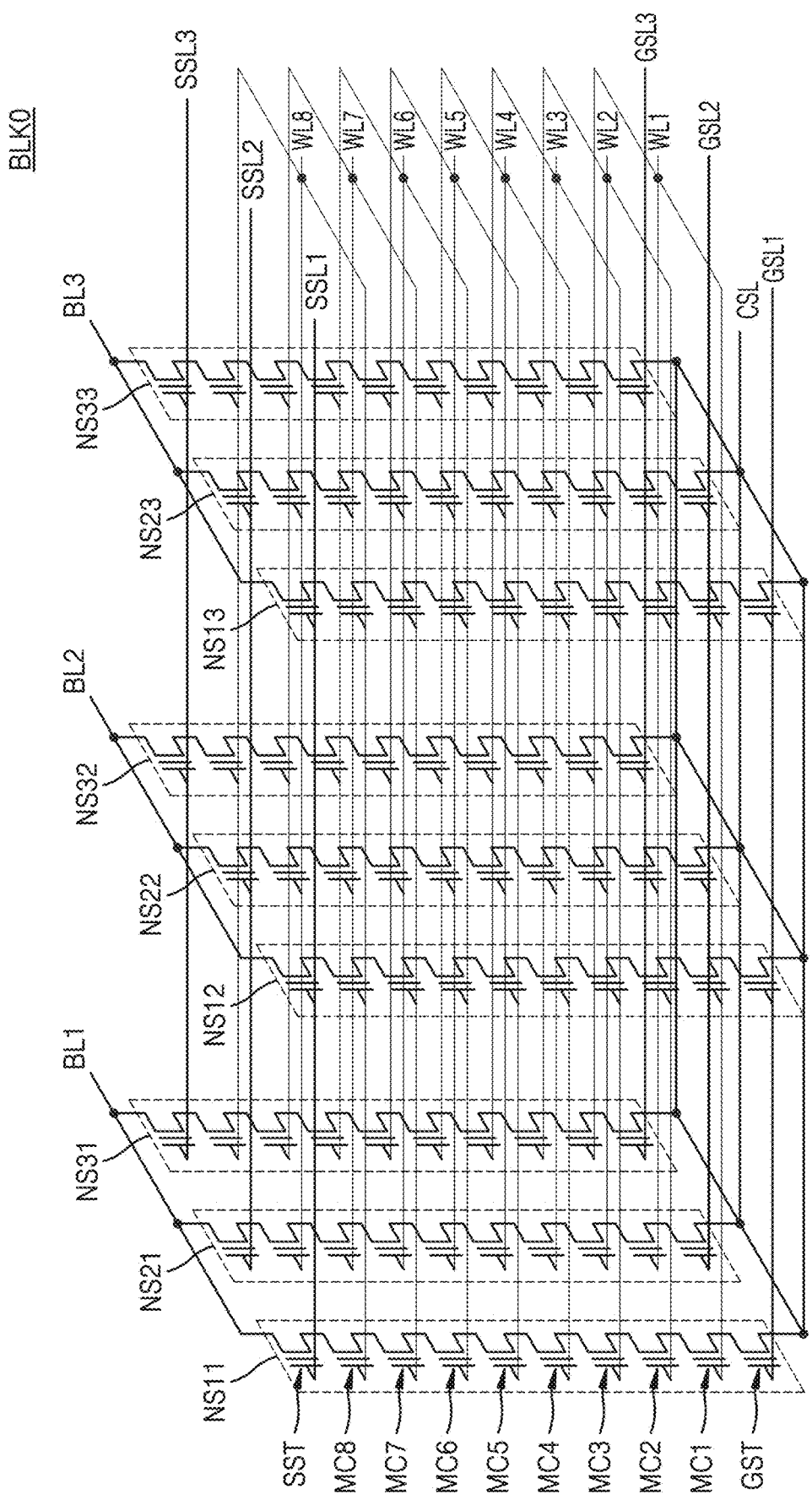
FIG. 5 is a circuit diagram of a memory block included in a memory cell array according to some example embodiments.

FIG. 5 is a circuit diagram of a memory block included in a memory cell array according to some example embodiments.

Referring to FIG. 5, the memory cell array (e.g., 110 in FIG. 2) may be a memory cell array of a vertical NAND flash memory. A memory block BLK0 included in the memory cell array may include a plurality of NAND cell strings (e.g., NS11 to NS33), a plurality of word lines (e.g., WL1 to WL8), a plurality of bit lines (e.g., BL1 to BL3), a plurality of ground selection lines (e.g., GSL1 to GSL3), a plurality of cell string selection lines (e.g., SSL1 to SSL3), and a common source line CSL. In some example embodiments, the number of NAND cell strings, the number of word lines, the number of bit lines, the number of ground selection lines, and/or the number of cell string selection lines may vary.

NAND cell strings NS11, NS21, and/or NS31 may be provided between a first bit line BL1 and/or the common source line CSL. NAND cell strings NS12, NS22, and/or NS32 may be provided between a second bit line BL2 and/or the common source line CSL. NAND cell strings NS13, NS23, and/or NS33 may be provided between a third bit line BL3 and/or the common source line CSL. Each NAND cell string (e.g., NS11) may include a cell string selection transistor SST, a plurality of memory cells (e.g., MC1 to MC8), and/or a ground selection transistor GST, which may be connected in series.

NAND cell strings connected in common to one bit line may constitute one column. For example, the NAND cell strings NS11, NS21, and/or NS31 connected in common to the first bit line BL1 may correspond to a first column, the NAND cell strings NS12, NS22, and/or NS32 connected in common to the second bit line BL2 may correspond to a second column, and/or NAND cell strings NS13, NS23, and/or NS33 connected in common to the third bit lines BL3 may correspond to a third column.

NAND cell strings connected in common to one cell string selection line may constitute one row. For example, the NAND cell strings NS11, NS12, and/or NS13 connected to a first cell string selection line SSL1 may correspond to a first row, the NAND cell strings NS21, NS22, and/or NS23 connected to a second cell string selection line SSL2 may correspond to a second row, and/or the NAND cell strings NS31, NS32, and/or NS33 connected to a third cell string selection line SSL3 may correspond to a third row.

The cell string selection transistor SST may be connected to the first to third cell string selection lines SSL1 to SSL3 corresponding thereto. First to eighth memory cells MC1 to MC8 may be connected to first to eighth word lines WL1 to WL8 respectively corresponding thereto. The ground selection transistor GST may be connected to first to third ground selection lines GSL1 to GSL3 corresponding thereto. The cell string selection transistor SST may be connected to the first to third bit lines BL1 to BL3 corresponding thereto, and/or the ground selection transistor GST may be connected to the common source line CSL.

Word lines (e.g., WL1) located at the same level may be connected in common to each other, the first to third cell string selection lines SSL1 to SSL3 may be separated from each other, and/or the first to third ground selection lines GSL1 to GSL3 may be separated from each other. For example, when memory cells that are connected to the first word line WL1 and/or that belong to the cell strings NS11, NS12, and/or NS13 are programmed, the first word line WL1 and/or the first cell string selection line SSL1 may be selected. The first to third ground selection lines GSL1 to GSL3 may be connected in common to each other.

Figure 6:
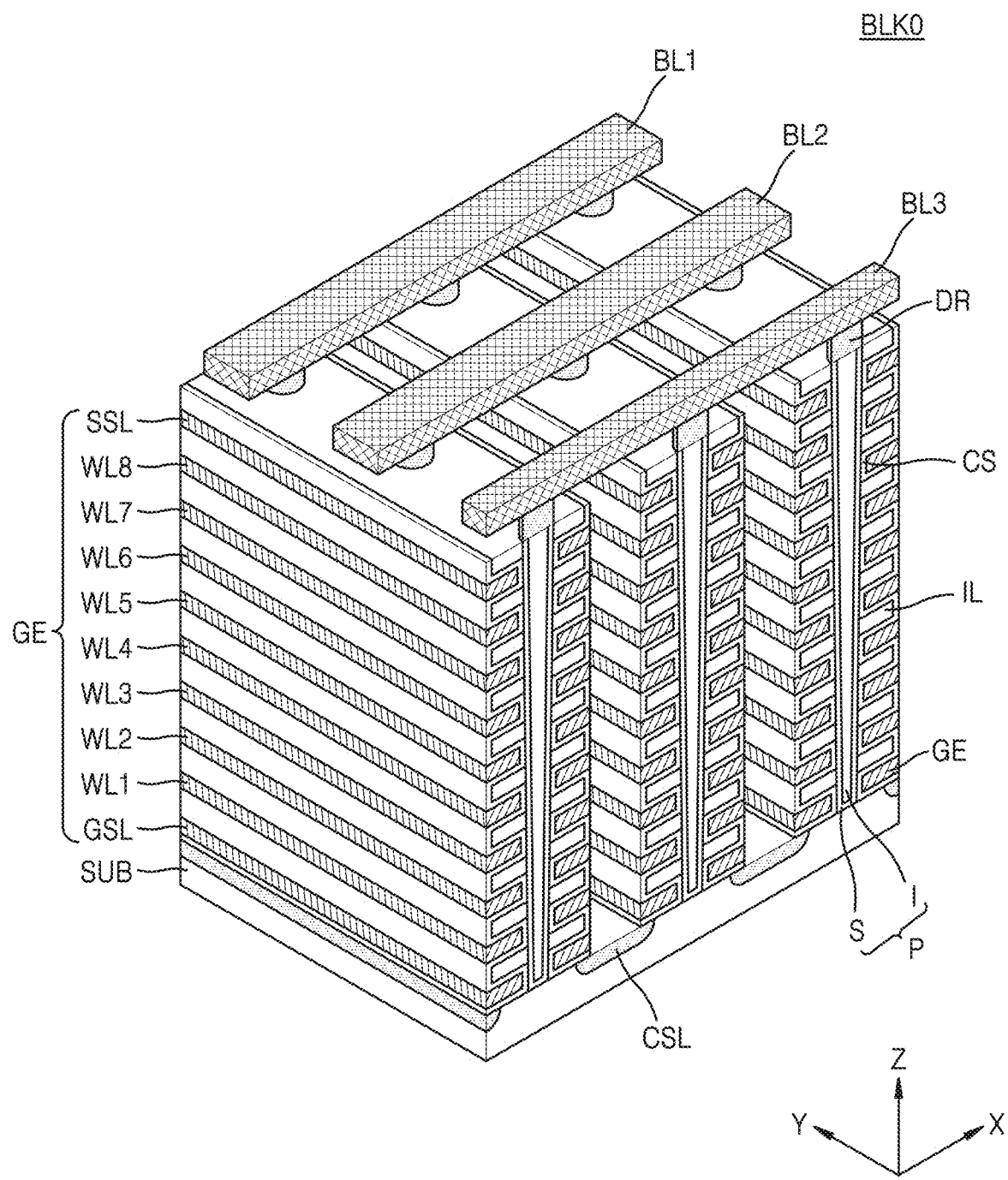
FIG. 6 is a perspective view of the memory block of FIG. 5.

FIG. 6 is a perspective view of the memory block of FIG. 5.

Referring to FIG. 6, each memory block included in the memory cell array (e.g., 110 in FIG. 2) may be formed in a vertical direction to a substrate SUB. Although FIG. 6 illustrates an example in which the memory block includes two selection lines GSL and SSL, eight word lines WL1 to WL8, and/or three bit lines BL1 to BL3, the memory block in some example embodiments may include more or fewer selection lines, word lines, and/or bit lines than those described above.

The substrate SUB may be of a first conductivity type (e.g., a p type). A common source line CSL may be provided on the substrate SUB and/or may extend in a first direction (e.g., Y direction). The common source line CSL may be doped with impurities of a second conductivity type (e.g., an n type). A plurality of insulating films IL may be provided on a region of the substrate SUB between two adjacent common source lines CSL and/or may extend in the first direction. The plurality of insulating films IL may be sequentially provided and/or may be spaced a predetermined distance apart from each other in a third direction (e.g., a Z direction). For example, the plurality of insulating films IL may include an insulating material, such as silicon oxide.

A plurality of pillars P may be provided on a region of the substrate SUB between two adjacent common source lines CSL and/or sequentially arranged in the first direction. The plurality of pillars P may pass through the plurality of insulating films IL in the third direction. For example, the plurality of pillars P may pass through the plurality of insulating films IL and/or may contact the substrate SUB. A surface layer S of each of the pillars P may include a first-type silicon material and/or may function as a channel region. An inner layer I of each of the pillars P may include an insulating material (e.g., silicon oxide) or an air gap.

A charge storage layer CS may be provided along exposed surfaces of the insulating films IL, the pillars P, and/or the substrate SUB between two adjacent common source lines CSL. The charge storage layer CS may include a gate insulating layer (or referred to as a 'tunnelling insulating layer'), a charge trap layer, and/or a blocking insulating layer. For example, the charge storage layer CS may have an oxide-nitride-oxide (ONO) structure. Also, gate electrodes GE, such as the selection lines GSL and SSL and the word lines WL1 to WL8, may be provided on exposed surfaces of the charge storage layer CS in a region between two adjacent common source lines CSL.

Drains or drain contacts DR may be provided on the plurality of pillars P, respectively. For example, the drains or drain contacts DR may include a silicon material doped with impurities of the second conductivity type. Bit lines BL1 to BL3 may be provided on the drains DR. The bit lines BL1 to BL3 may extend in a second direction (e.g., an X direction) and/or may be spaced a predetermined distance apart from each other in the first direction.

Figure 7:
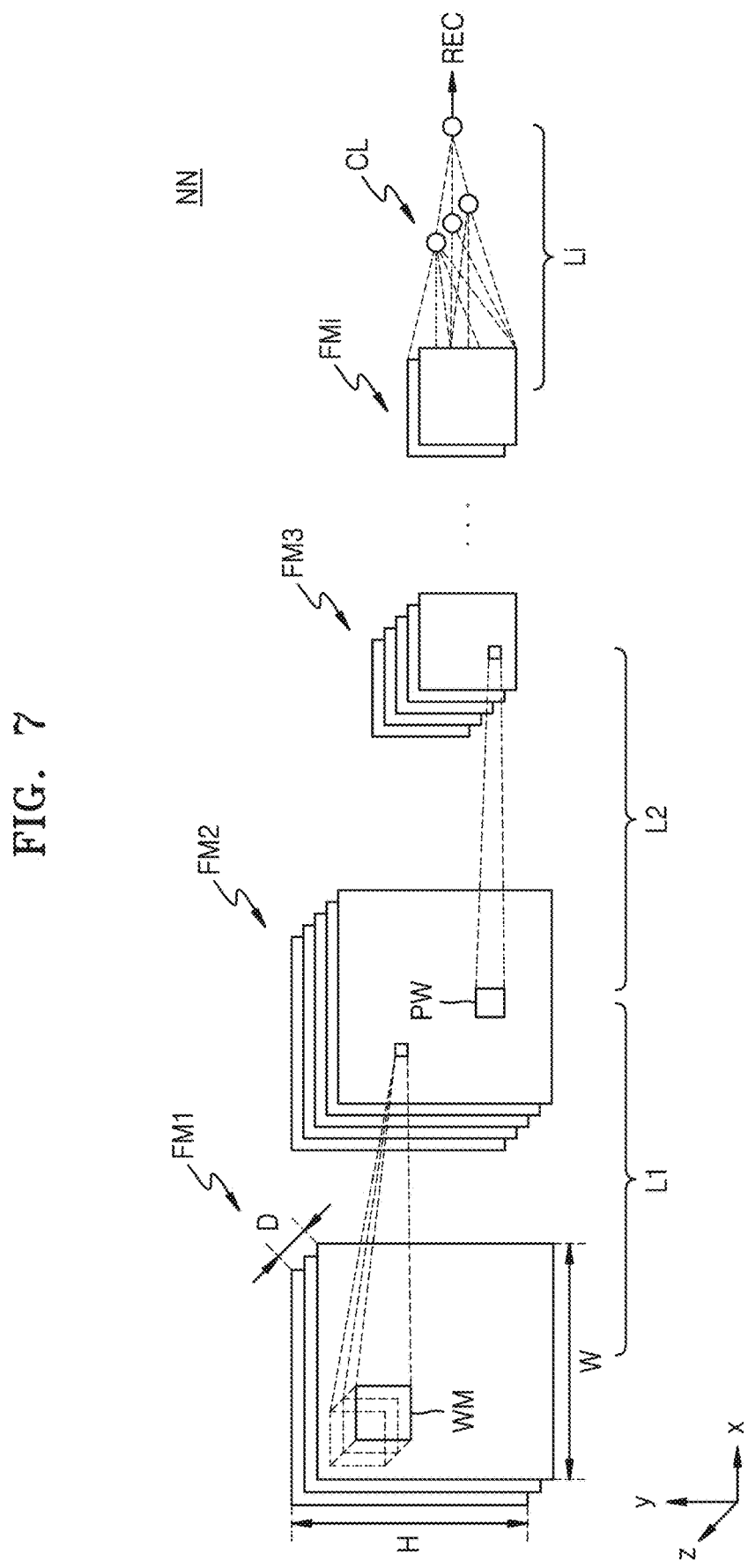
FIG. 7 is a diagram illustrating an operation of a memory system according to some example embodiments.

FIG. 7 is a diagram illustrating an operation of a memory system according to some example embodiments. FIG. 7 is a diagram of a structure of a convolution neural network, which is an example of a structure of a neural network. A non-volatile memory device of the memory system according to some example embodiments may constitute a portion of the neural network.

Referring to FIG. 7, a neural network NN may include a plurality of layers L1 to Li. Each of the layers L1 to Li may be a linear layer or a non-linear layer. In some example embodiments, a combination of at least one linear layer and at least one non-linear layer may be referred to as one layer. For example, a linear layer may include a convolution layer and/or a fully-connected layer, and a non-linear layer may include a pooling layer and/or an activation layer.

For example, a first layer L1 may be a convolution layer, a second layer L2 may be a pooling layer, and/or an i-th layer Li may be an output layer and/or a fully connected layer. In some example embodiments, the number of layers L1 to Li may vary, and/or the neural network NN may further include an activation layer and/or may further include a layer configured to perform another kind of operation.

Each of the first to i-th layers L1 to Li may receive input data (e.g., an input image frame) and/or a feature map generated at the previous layer as an input feature map. Each of the first to i-th layers L1 to Li may perform an arithmetic operation of a neural network on the input feature map and/or may generate an output feature map or a recognition signal REC. The feature map may refer to data in which various features of input data are expressed. Feature maps FM1, FM2, and/or FMi may have, for example, two-dimensional (2D) matrix forms or three-dimensional (3D) matrix (or tensor) forms. The feature maps FM1, FM2, and/or FMi may have a width W (or referred to as a column), a height H (or referred to as a row), and/or a depth D, which may respectively correspond to an x-axis, a y-axis, and/or a z-axis on coordinates. The depth D may be referred to as the number of channels.

The first layer L1 may convolute a first feature map FM1 with a weight map WM and/or may generate a second feature map FM2. The weight map WM may filter the first feature map FM1, and may be referred to as a filter or a kernel. A depth (i.e., number of channels) of the weight map WM may be equal to a depth (i.e., number of channels) of the first feature map FM1, and/or channels of the weight map WM may be respectively convolved with channels of the first feature map FM1 corresponding thereto. The weight map WM may be traversed and/or shifted using the first feature map FM1 as a sliding window. A shifted amount may be referred to as a "stride length" or a "stride." During each shift, each of weight values included in the weight map WM may be multiplied by and/or added to all feature data in a region where each of the weight values included in the weight map WM overlaps with the first feature map FM1. Data of the first feature map FM1 in the region where each of the weight values included in the weight map WM overlaps with the first feature map FM1 may be referred to as extraction data. When the first feature map FM1 is convolved with the weight map WM, one channel of the second feature map FM2 may be generated. Although one weight map WM is indicated in FIG. 7, a plurality of weight maps may be substantially convolved with the first feature map FM1, and/or a plurality of channels of the second feature map FM2 may be generated. In other words, the number of channels of the second feature map FM2 may correspond to the number of weight maps. In some example embodiments, all or part of the convolutional operation may be performed by the arithmetic circuitry 140 of the non-volatile memory device 100 shown in FIG. 1; by the computing circuitry 141 shown in FIG. 2; and/or as operation S150 of FIG. 3.

The second layer L2 may change a spatial size of the second feature map FM2 due to a pooling operation and/or may generate a third feature map FM3. The pooling operation may be referred to as a sampling operation or a down-sampling operation. A 2D pooling window PW may be shifted on the second feature map FM2 in size units of the pooling window PW, and/or a maximum value (or average value) of feature data of a region that overlaps with the pooling window PW may be selected. Thus, a third feature map FM3 having a changed spatial size may be generated from the second feature map FM2. The number of channels of the third feature map FM3 may be equal to the number of the channels of the second feature map FM2.

The i-th layer Li may combine features of an i-th feature map FMi and/or may classify a class CL of input data. Also, the i-th layer Li may generate a recognition signal REC corresponding to the class CL. In some example embodiments, the input data may correspond to frame data included in a video stream, and/or the i-th layer Li may extract a class CL corresponding to an object included in an image indicated by the frame data, based on an i-th feature map FMi provided by a previous layer, recognize the object, and/or may generate a recognition signal REC corresponding to the recognized object.

Figure 8A:
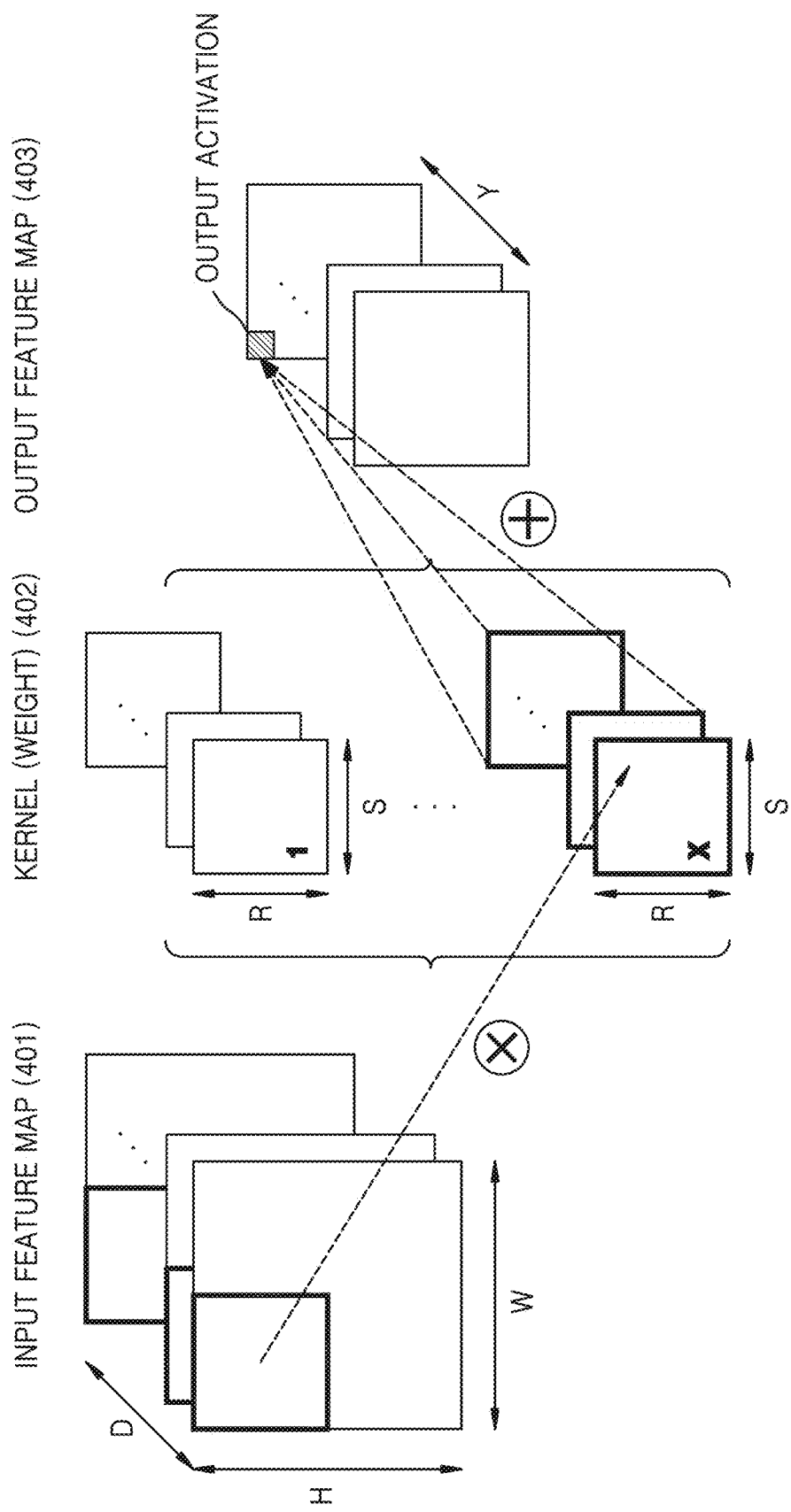
FIGS. 8A and 8B are diagrams illustrating a convolution operation of a neural network.
Figure 8B:
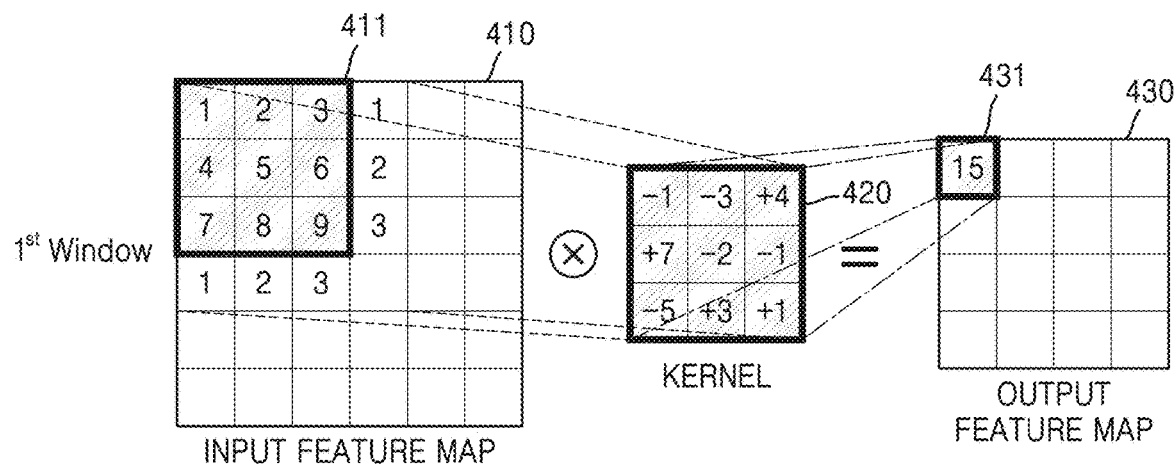
Figure 8B:
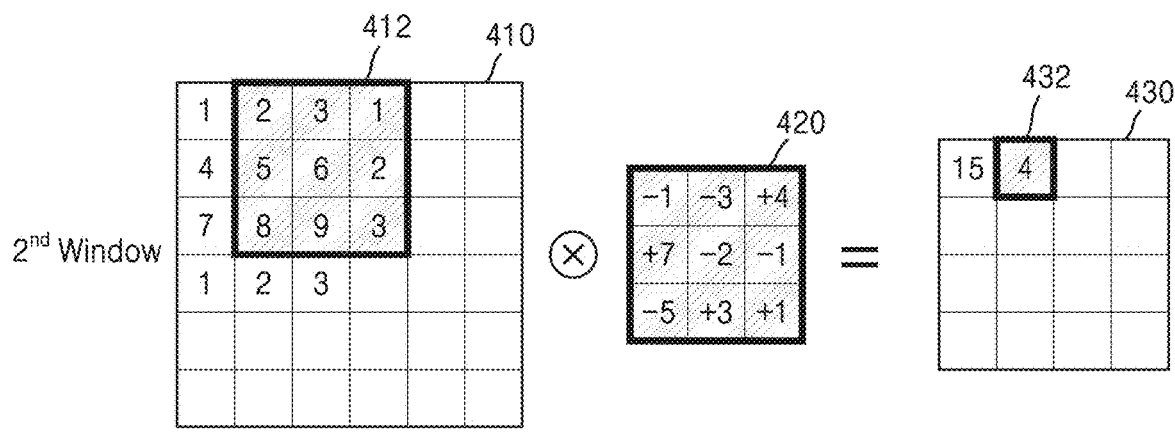
Figure 8B:
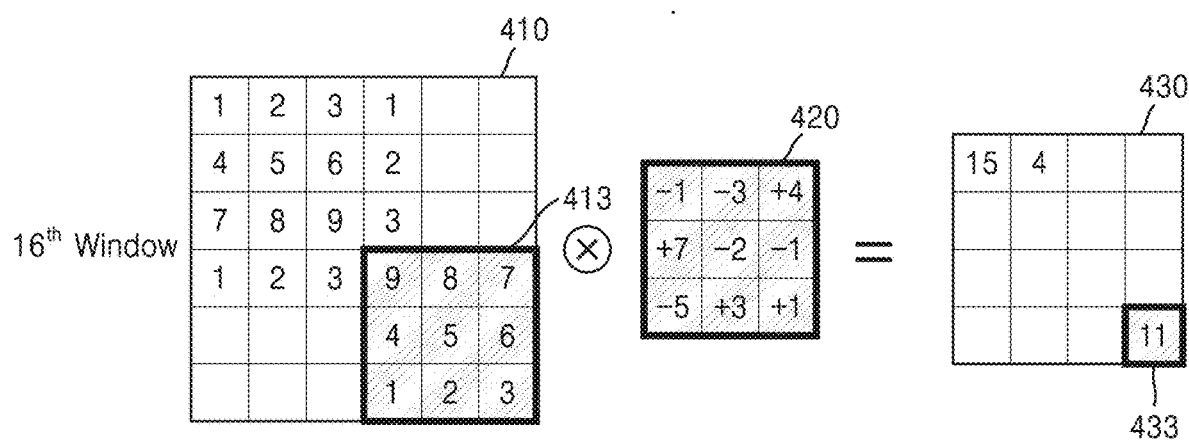

FIGS. 8A and 8B are diagrams illustrating an example of a convolution operation of a neural network. In some example embodiments, all or part of the convolutional operation of FIGS. 8A and 8B may be performed by the arithmetic circuitry 140 of the non-volatile memory device 100 shown in FIG. 1; by the computing circuitry 141 shown in FIG. 2; and/or as operation S150 of FIG. 3.

Referring to FIG. 8A, input feature maps 401 may include D channels, and/or an input feature map of each channel may have a size of H rows and/or W columns (each of D, H, and W may be a natural number). Each of kernels 402 may have a size of R rows and S columns, and the kernels 402 may include channels in a number equal to the number (or depth) D of the channels of the input feature maps 401 (each of R and S may be a natural number). Output feature maps 403 may be generated using a 3D convolution operation between the input feature maps 401 and/or the kernels 402, and/or may include Y channels due to the 3D convolution operation.

A process of generating an output feature map using a convolution operation between an input feature map and a kernel may be described with reference to FIG. 8B. A 2D convolution operation to be described with reference to FIG. 8B may be performed between input feature maps 401 of a plurality of channels and kernels 402 of all such channels, thereby generating output feature maps 403 of all such channels.

In FIG. 8B, the input feature map 410 has a size of 6×6, an original kernel 420 has a size of 3×3, and an output feature map 430 has a size of 4×4. However, some example embodiments of some inventive concepts may not be limited thereto; for example, the neural network may be implemented as feature maps and/or kernels having various sizes. Also, values shown in FIG. 8B for the input feature map 410, the original kernel 420, and/or the output feature map 430 may be only examples, and some example embodiments of some inventive concepts may not be limited by the defined values.

The original kernel 420 may perform a convolution operation while sliding in units of windows with a size of 3×3 in the input feature map 410. The convolution operation may be an arithmetic operation of a neural network, for example, obtaining each feature data of the output feature map 430 by summing all values that are obtained by multiplying each feature data of any window of the input feature map 410 by each of weight values of a corresponding position of the original kernel 420. Data included in the window of the input feature map 410, which is multiplied by the weight values, may be referred to as extraction data, which is extracted from the input feature map 410. The original kernel 420 may firstly perform a convolution operation on first extraction data 411 of the input feature map 410. That is, feature data 1, 2, 3, 4, 5, 6, 7, 8, and 9 of the first extraction data 411 may be respectively multiplied by weight values −1, −3, 4, 7, −2, −1, −5, 3, and 1 of the original kernel 420 respectively corresponding thereto, and −1, −6, 12, 28, −10, −6, −35, 24, and 9 may be obtained as multiplication results. Next, all the obtained values −1, −6, 12, 28, −10, −6, −35, 24, and 9 may be summed to obtain 15, and feature data 431 in a first row and a first column of the output feature map 430 may be determined to be 15. Here, the feature data 431 in the first row and the first column of the output feature map 430 may correspond to the first extraction data 411. Similarly, a convolution operation may be performed between second extraction data 412 of the input feature map 410 and the original kernel 420 so that feature data 432 in the first row and a second column of the output feature map 430 may be determined to be 4. Finally, a convolution operation may be performed between sixteenth extraction data 413, which is final extraction data of the input feature map 410, and the original kernel 420 so that feature data 433 in a fourth row and a fourth column of the output feature map 430 may be determined to be 11.

In other words, a convolution operation between an input feature map 410 and an original kernel 420 may be performed by repeatedly multiplying extraction data of the input feature map 410 by weight values of the original kernel 420 corresponding thereto and summing the multiplication results, and/or the output feature map 430 may be generated as a result of the convolution operation. The In some example embodiments, the arithmetic circuitry 140 of the non-volatile memory device 100 shown in FIG. 1 may perform a convolution operation. For example, arithmetic input data DATA_EX may constitute the input feature map 410, and/or arithmetic internal data DATA_IN may constitute the original kernel 420.

Figure 9:
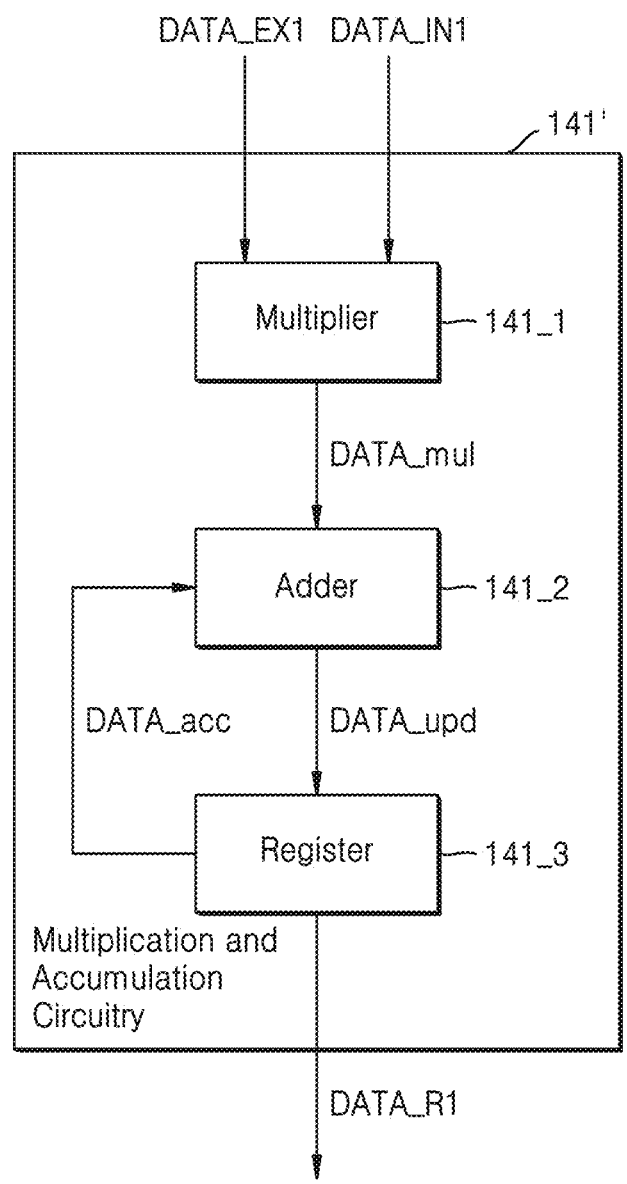
FIG. 9 is a diagram of a computing circuit included in a non-volatile memory device according to some example embodiments.

FIG. 9 is a diagram of computing circuitry included in a non-volatile memory device according to some example embodiments. The computing circuitry shown in FIG. 9 is only an example, and computing circuitry according to some example embodiments of some inventive concepts may not be limited thereto and may have various configurations. A first arithmetic operation of a neural network using first arithmetic internal data DATA_IN1 and/or first arithmetic input data DATA_EX1 are described as examples with reference to FIG. 9, but some example embodiments of some inventive concepts may not be limited thereto and may be also applied to a k-th arithmetic operation of a neural network using k-th arithmetic internal data DATA_INk and/or k-th arithmetic input data DATA_EXk.

FIGS. 2 and 9 illustrate an example in which the first arithmetic input data DATA_EX1 is received by the memory device 100 and/or the first arithmetic internal data DATA_IN1 is transmitted by the memory cell array 110. However, the same descriptions may be applied to second to k-th arithmetic internal data DATA_IN2 to DATA_INk and/or second to k-th arithmetic input data DATA_EX2 to DATA_EXk.

The computing circuitry 141' may include multiplication and accumulation circuitry (MAC). Although FIG. 9 illustrates a case in which the computing circuitry 141' includes one MAC, some example embodiments of some inventive concepts may not be limited thereto, and/or the computing circuitry 141' may include a plurality of MACs. For example, the first arithmetic input data DATA_EX1 may be j-bit data (here, j is a natural number), and the first arithmetic internal data DATA_IN1 may be j-bit data. For example, each of the first arithmetic input data DATA_EX1 and the first arithmetic internal data DATA_IN1 may be 8-bit data.

The computing circuitry 141' may perform a multiplication operation and/or an addition operation using the first arithmetic input data DATA_EX1 and/or the first arithmetic internal data DATA_IN1, and/or may generate and/or output first arithmetic result data DATA_R1. For example, the first arithmetic result data DATA_R1 may be 2j-bit data or (2j+1)-bit data.

In some example embodiments, the computing circuitry 141' may include a multiplier 141_1, an adder 141_2, and/or a register 141_3. The computing circuitry 141' may perform a multiplication operation using the multiplier 141_1 and/or accumulate data using the adder 141_2 and/or the register 141_3.

The multiplier 141_1 may multiply the first arithmetic input data DATA_EX1 by the first arithmetic internal data DATA_IN1, generate multiplication data DATA_mul, and/or provide the multiplication data DATA_mul to the adder 141_2.

The register 141_3 may temporarily store arithmetic data. The register 141_3 may provide the stored arithmetic data as accumulation data DATA_acc to the adder 141_2.

The adder 141_2 may add the multiplication data DATA_mul to the accumulation data DATA_acc provided by the register 141_3 and/or generate updated data DATA_upd. That is, the adder 141_2 may add the multiplication data DATA_mul to the arithmetic data provided by the register 141_3 and may store a sum of the multiplication data and the arithmetic data. The register 141_3 may output the arithmetic data as the first arithmetic result data DATA_R1 at or during a time point.

Figure 10:
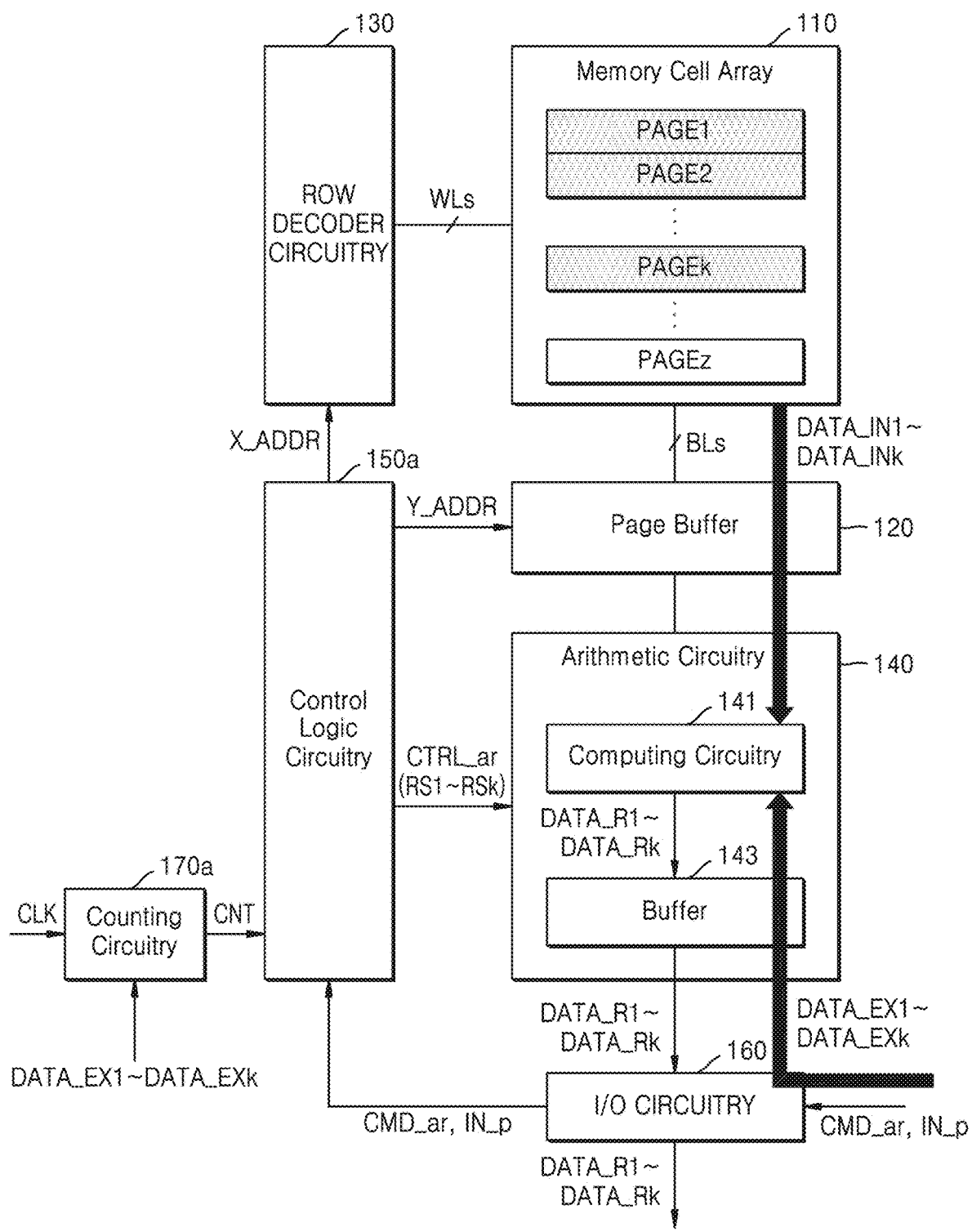
FIG. 10 is a detailed block diagram of the non-volatile memory device of FIG. 1, according to some example embodiments.

FIG. 10 is a detailed block diagram of the non-volatile memory device 100 of FIG. 1, according to some example embodiments. The same descriptions of a non-volatile memory device 100a of FIG. 10 as in the non-volatile memory device 100 of FIG. 2 are omitted.

Referring to FIG. 10, the non-volatile memory device 100a may include a memory cell array 110, a page buffer 120, row decoder circuitry 130, arithmetic circuitry 140, control logic circuitry 150a, I/O circuitry 160, and/or counting circuitry 170a. Although the counting circuitry 170a is illustrated as an additional circuitry component, the counting circuitry 170a may be included in the control logic circuitry 150a and/or may perform a counting operation inside the control logic circuitry 150a.

The counting circuitry 170a may receive a clock signal CLK and/or may sequentially receive first to k-th arithmetic input data DATA_EX1 to DATA_EXk. In some example embodiments, the counting circuitry 170a may count the number of clock signals from a time point in which the first arithmetic input data DATA_EX1 is received by the memory device 100a and/or may provide a counting value CNT to the control logic circuitry 150a. In some example embodiments, the clock signal CLK may be a signal generated inside the non-volatile memory device 100a.

The control logic circuitry 150a may generate first to k-th data ready signals RS1 to RSk based on a counting value CNT and/or may output the first to k-th data ready signals RS1 to RSk to the arithmetic circuitry 140. The arithmetic control signal CTRL_ar may include the first to k-th data ready signals RS1 to RSk. Although FIG. 10 illustrates the first to k-th data ready signals RS1 to RSk as separate signals, some example embodiments of some inventive concepts may not be limited thereto, and each of the first to k-th data ready signals RS1 to RSk may be provided as an identical data ready signal.

The arithmetic circuitry 140 may perform a first arithmetic operation of a neural network on the first arithmetic input data DATA_EX1 and/or the first arithmetic internal data DATA_IN1 in response to the first data ready signal RS1 and/or may perform a k-th arithmetic operation of a neural network on the k-th arithmetic input data DATA_EXk and/or k-th arithmetic internal data DATA_INk in response to the k-th data ready signal RSk.

The non-volatile memory device 100a according to some example embodiments may receive an arithmetic input data signal including the first to k-th arithmetic input data DATA_EX1 to DATA_EXk (e.g., from the memory controller 200 in FIG. 1). To perform each of the first to k-th arithmetic operations of a neural network, the non-volatile memory device 100a may divide each of the first to k-th arithmetic input data DATA_EX1 to DATA_EXk from the arithmetic input data signal using the counting circuitry 170a.

The counting circuitry 170a may be implemented as various types in the non-volatile memory device 100a. In some example embodiments, the counting circuitry 170a may be implemented as a hardware type or a software type. For example, when the counting circuitry 170a is implemented as a software type, programs (or instructions) and/or random I/O code stored in the non-volatile memory device 100a may be executed by the control logic circuitry 150a or at least one processor included in the non-volatile memory device 100a to perform the counting operation.

Figure 11:
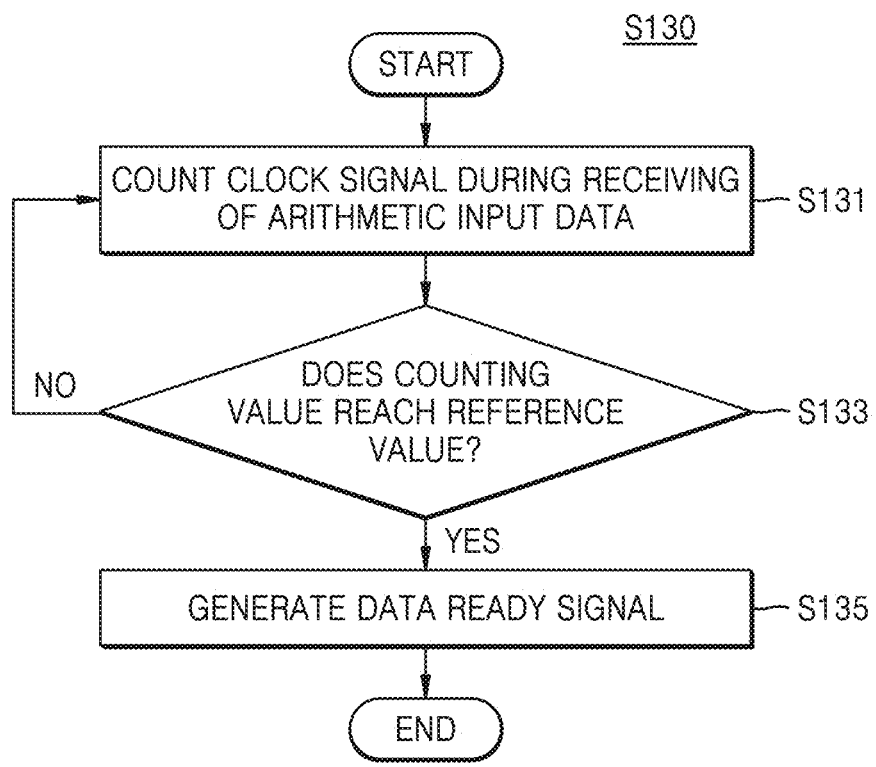
FIG. 11 is a flowchart of a method of operating a non-volatile memory device, according to some example embodiments, illustrating operation S130 of FIG. 3.

FIG. 11 is a flowchart of a method of operating a non-volatile memory device according to some example embodiments, illustrating operation S130 of FIG. 3. Operation S130 may include operation S131, operation S133, and/or operation S135. Although an operation of receiving first arithmetic input data DATA_EX1 is described as an example with reference to FIG. 11, some example embodiments of some inventive concepts may not be limited thereto. For example, the operation of receiving arithmetic input data may include an operation of receiving k-th arithmetic input data DATA_EXk.

Referring to FIGS. 10 and 11, in operation S131, the non-volatile memory device 100a may count a clock signal during the receiving of arithmetic input data. For example, the clock signal may be counted from a time point in which the first arithmetic input data DATA_EX1 is received.

In operation S133, the non-volatile memory device 100a may compare a counting value obtained by counting the clock signal with a reference value and/or may determine whether the counting value reaches the reference value. The reference value may be a desired and/or preset value. When the clock signal is counted until the counting value reaches the reference value, it may be determined that the arithmetic input data has been received by such a bit number as to perform an arithmetic operation of a neural network. For example, when the counting value of the clock signal is 8, it may be determined that the non-volatile memory device 100a has received all of the first arithmetic input data DATA_EX1.

In some example embodiments, after the counting value reaches the reference value, the non-volatile memory device 100a may reset the counting value and may count the clock signal again (S131) to determine whether the counting value reaches the reference value (S133). Accordingly, when the counting value firstly reaches the reference value, the non-volatile memory device 100a may determine that all of the first arithmetic input data DATA_EX1 has been received. When the counting value reaches the reference value after the counting value is reset, the non-volatile memory device 100 may determine that all of second arithmetic input data DATA_EX2 has been received.

In some other example embodiments, after the counting value reaches a first reference value, the non-volatile memory device 100a may count the clock signal (S131) and determine, again, whether the counting value reaches a second reference value higher than the first reference value (S133). Accordingly, when the counting value reaches the first reference value, the non-volatile memory device 100a may determine that all of the first arithmetic input data DATA_EX1 has been received. Also, when the counting value reaches the second reference value, the non-volatile memory device 100a may determine that all of the second arithmetic input data DATA_EX2 has been received.

In operation S135, the non-volatile memory device 100a may generate a data ready signal when the counting value reaches the reference value. For instance, when the counting value reaches the reference value and it is determined that all of the first arithmetic input data DATA_EX1 is received, the non-volatile memory device 100a may generate the first data ready signal. The non-volatile memory device 100a may perform a first arithmetic operation of a neural network on the first arithmetic input data DATA_EX1 and/or first arithmetic internal data DATA_IN1 in response to the first data ready signal.

Figure 12A:
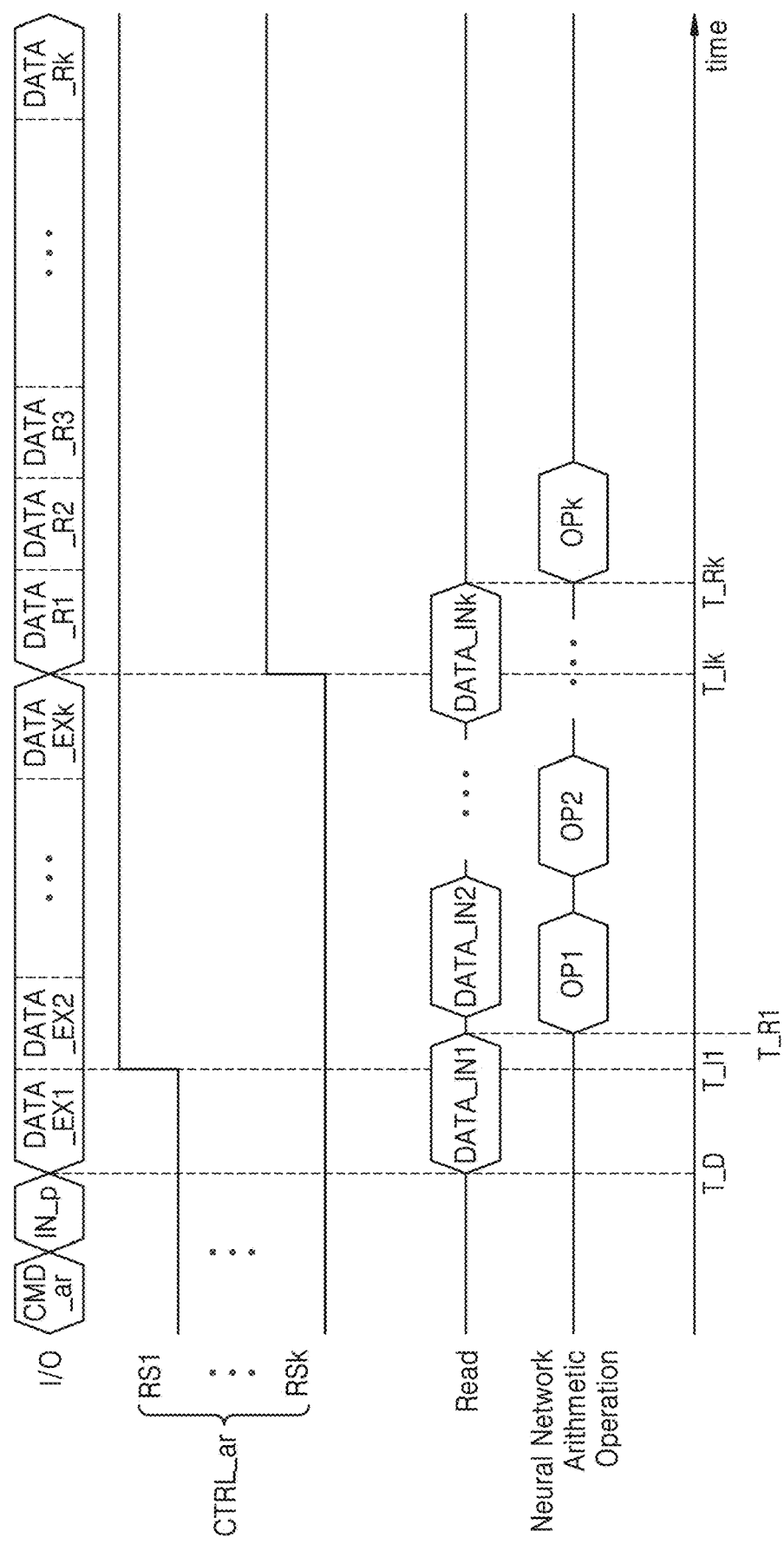
FIGS. 12A and 12B are timing diagrams illustrating an arithmetic operation of a neural network involving a non-volatile memory device according to some example embodiments.
Figure 12B:
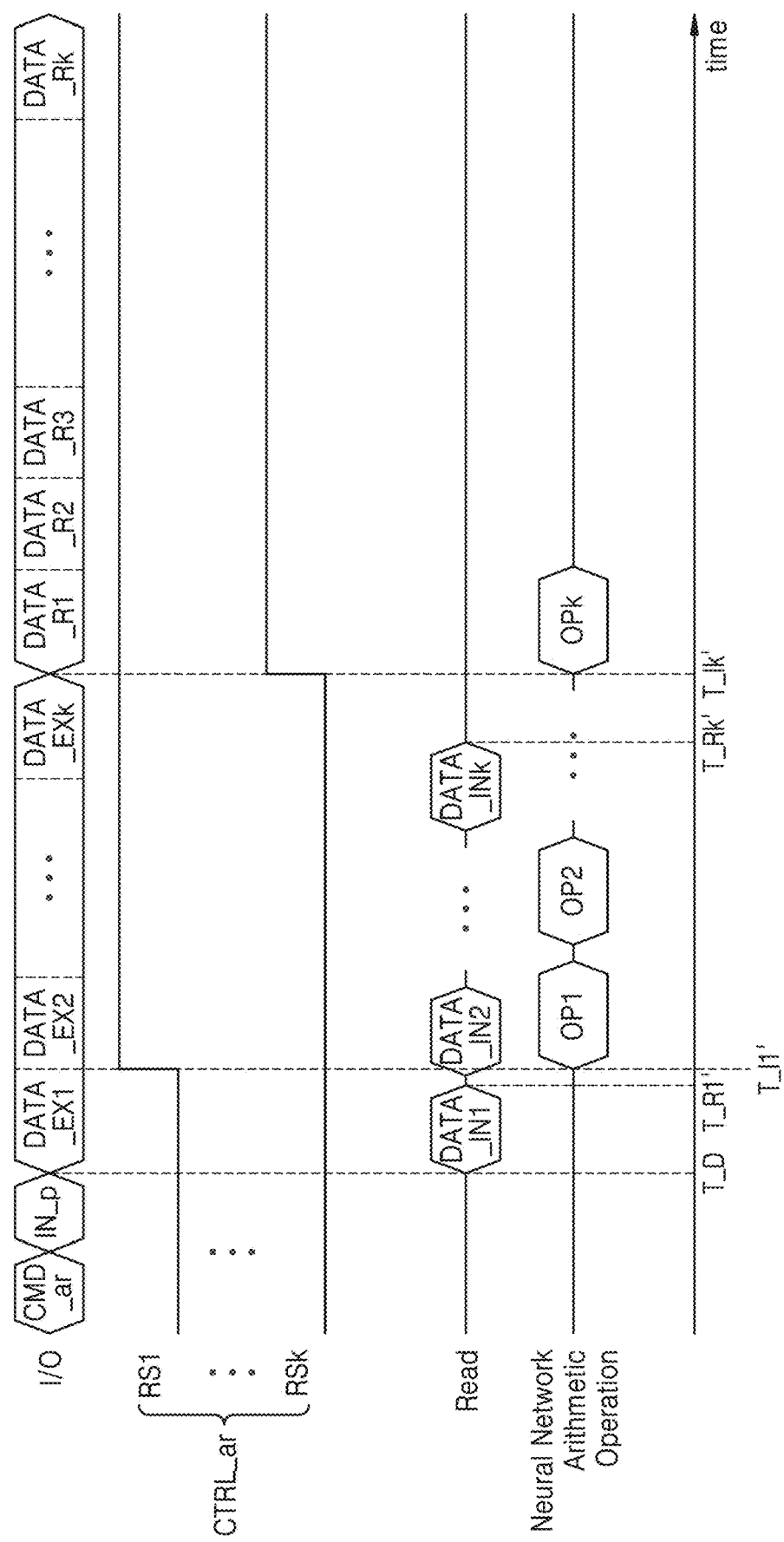

FIGS. 12A and 12B are timing diagrams illustrating an arithmetic operation of a neural network using a non-volatile memory device according to some example embodiments. The timing diagrams of FIGS. 12A and 12B are described with reference to the non-volatile memory device 100a of FIG. 10, but similar descriptions may apply to the non-volatile memory device 100 of FIG. 2. In FIGS. 12A and 12B, a description of an operation on first arithmetic internal data DATA_IN1 may apply to an operation on k-th arithmetic internal data DATA_Ink. Similarly, a description of an operation on first arithmetic input data DATA_EX1 may also be applied to an operation on k-th arithmetic input data DATA_EXk.

Referring to FIGS. 10 and 12A, when an arithmetic command CMD_ar and/or an arithmetic information signal IN_p are received through the I/O circuitry 160 (refer to a time point T_D), an operation of receiving the first arithmetic input data DATA_EX1 may begin, and/or an operation of reading the first arithmetic internal data DATA_IN1 may begin. That is, the operation of receiving the first arithmetic input data DATA_EX1 and/or the operation of reading the first arithmetic internal data DATA_IN1 may be performed in series, in parallel, partly in series and partly in parallel, etc.

When all the first arithmetic input data DATA_EX1 is received (refer to a time point T_11), a first data ready signal RS1 may be generated and/or provided to the arithmetic circuitry 140. For example, when all the first arithmetic input data DATA_EX1 is received, the first data ready signal RS1 may be changed from a low level to a high level. However, some example embodiments of some inventive concepts may not be limited thereto. For example, in some example embodiments, the first data ready signal RS1 may be changed from the high level to the low level. Similarly, although the first to k-th data ready signals RS1 to RSk are illustrated as separate signals, some example embodiments of some inventive concepts may not be limited thereto. For example, the first to k-th data ready signals RS1 to RSk may be provided as a single data ready signal.

In some example embodiments, after all the first arithmetic input data DATA_EX1 is received (refer to the time point T_11), the operation of reading the first arithmetic internal data DATA_IN1 may be completed (refer to a time point T_R1). After the operation of receiving the first arithmetic input data DATA_EX1 and/or the operation of reading the first arithmetic internal data DATA_IN1 are completed (refer to the time point T_R1), the non-volatile memory device 100a may perform a first arithmetic operation OP1 of a neural network on the first arithmetic input data DATA_EX1 and/or the first arithmetic internal data DATA_IN1. For example, the arithmetic circuitry 140 may perform the first arithmetic operation OP1 of a neural network based on the time point T_11 in which the first data ready signal RS1 is received and/or the time point T_R1 in which the operation of reading the first arithmetic internal data DATA_IN1 is completed.

After all the first arithmetic input data DATA_EX1 that is used as an operand of a first arithmetic operation of the neural network is received (refer to the time point T_11), the non-volatile memory device 100a may subsequently receive second arithmetic input data DATA_EX2 that is used as an operand of a second arithmetic operation of the neural network. Also, with respect the operation of reading the first arithmetic internal data DATA_IN1 (refer to the time point T_R1), the non-volatile memory device 100a may concurrently and/or subsequently perform an operation of reading second arithmetic internal data DATA_IN2. Accordingly, the operation of receiving the second arithmetic input data DATA_EX2 and/or the operation of reading the second arithmetic internal data DATA_IN2 may be performed in series, in parallel, partly in series and partly in parallel, etc. Similarly, the first arithmetic operation OP1 of a neural network may be performed in series, in parallel, partly in series and partly in parallel, etc.

When all the k-th arithmetic input data DATA_EXk is received (refer to a time point T_lk), first to k-th arithmetic result data DATA_R1 to DATA_Rk stored in a buffer 143 may be sequentially output through the I/O circuitry 160. In some example embodiments, while the first arithmetic result data DATA_R1 is being output, an operation of reading arithmetic internal data, for example, k-th arithmetic internal data DATA_Ink, may be performed.

After the operation of reading the k-th arithmetic internal data DATA_INk is completed (refer to a time point T_Rk), a k-th arithmetic operation OPk of a neural network may be performed. In some example embodiments, while the first arithmetic result data DATA_R1 is being output, an arithmetic operation of a neural network, for example, a k-th arithmetic operation OPk of the neural network may be performed on the k-th arithmetic input data DATA_EXk and/or the k-th arithmetic internal data DATA_INk.

Referring to FIGS. 10 and 12B, after an operation of reading the first arithmetic internal data DATA_IN1 is completed (refer to a time point T_R1'), all the first arithmetic input data DATA_EX1 may be received (refer to a time point T_11'). After the operation of receiving the first arithmetic input data DATA_EX1 (refer to the time point T_11') and/or the operation of reading the first arithmetic internal data DATA_IN1 (refer to the time point T_R1') are all completed, the non-volatile memory device 100a may perform the first arithmetic operation OP1 of a neural network on the first arithmetic input data DATA_EX1 and/or the first arithmetic internal data DATA_IN1. That is, the first arithmetic operation OP1 of a neural network may be performed based on a later completion point (e.g., T_R1 of FIG. 12A or T_11' of FIG. 12B) from among a completion point of the operation of reading the first arithmetic internal data DATA_IN1 and/or a completion point of the operation of receiving the first arithmetic input data DATA_EX1.

When all the k-th arithmetic input data DATA_EXk is received (refer to a time point T_lk'), the first to k-th arithmetic result data DATA_R1 to DATA_Rk stored in the buffer 143 may be sequentially output through the I/O circuitry 160. In some example embodiments, while the first arithmetic result data DATA_R1 is being output, the non-volatile memory device 100a may perform an arithmetic operation of a neural network, for example, the k-th arithmetic operation OPk of a neural network may be performed on the k-th arithmetic input data DATA_EXk and/or the k-th arithmetic internal data DATA_INk.

The non-volatile memory device 100a according to some example embodiments of some inventive concepts may perform at least two instances of an operation of receiving arithmetic input data, an operation of reading arithmetic internal data from the memory cell array 110, and/or an arithmetic operation of a neural network using arithmetic input data and arithmetic internal data in series, in parallel, partly in series and partly in parallel, etc. Accordingly, the times taken for the non-volatile memory device 100a to concurrently and/or sequentially perform the first to k-th arithmetic operations OP1 to OPk of a neural network and output the first to k-th arithmetic result data DATA_R1 to DATA_Rk to the memory controller, and consequently the processing time of the neural network, may be reduced.

Figure 13:
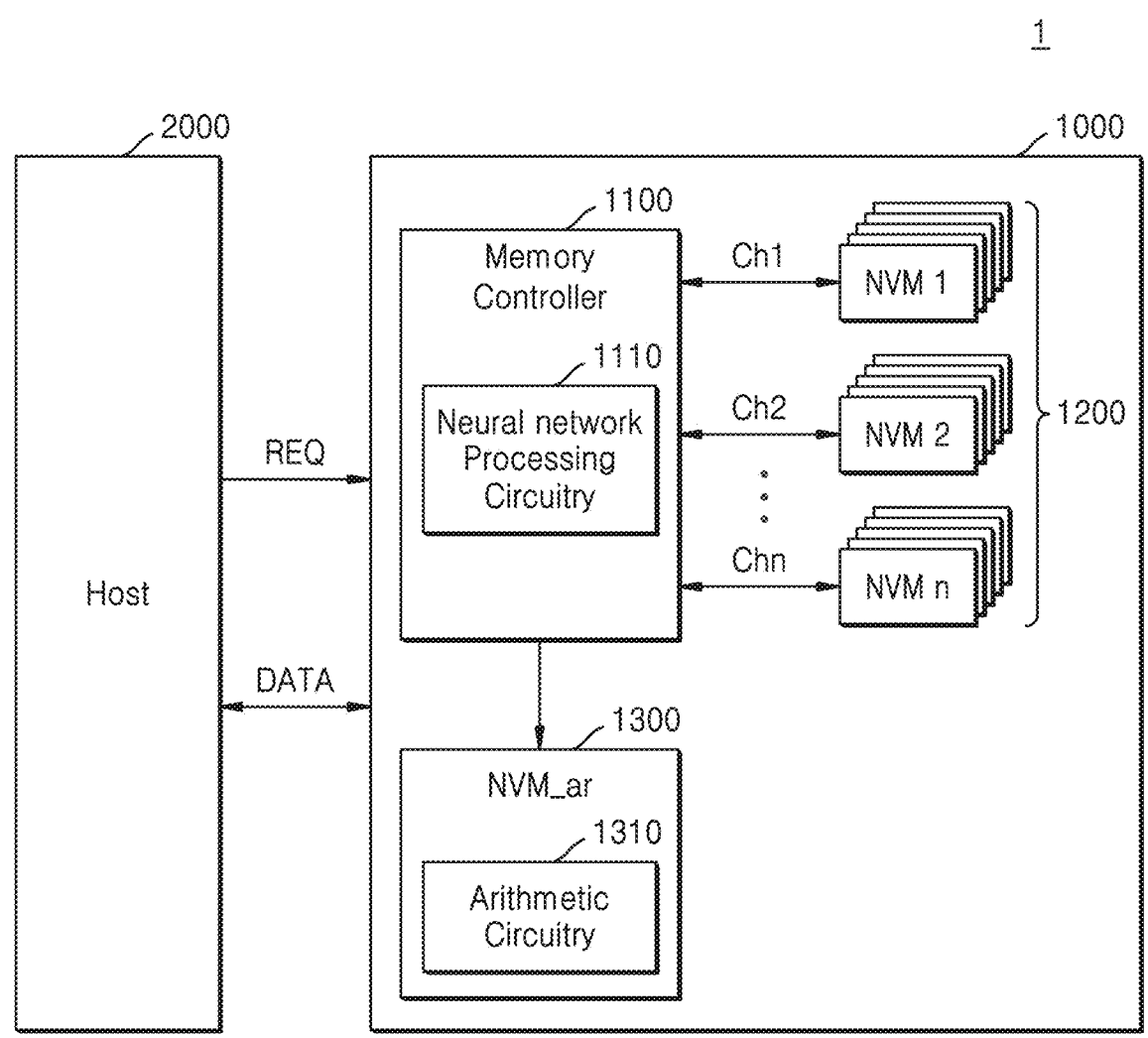
FIG. 13 is a block diagram of a solid-state drive (SSD) according to some example embodiments.

FIG. 13 is a block diagram of an SSD system 1 according to some example embodiments.

Referring to FIG. 13, the SSD system 1 may include a host 2000 and/or an SSD 1000. The SSD 1000 may transmit and/or receive signals to and from the host 2000 through a signal connector.

The host 2000 may provide data DATA and/or a request REQ to the SSD controller 1100. For example, the host 2000 may provide a request REQ (e.g., a read request, a write request, or an arithmetic request) for the data DATA to the SSD controller 1100. In addition, the host 2000 may provide commands, addresses, and/or priority information to the SSD controller 1100, but is not limited thereto. The host 2000 and the SSD controller 1100 may exchange data and signals with each other based on at least one of various interface protocols, such as a universal serial bus (USB) protocol, a multimedia card (MMC) protocol, a serial advanced technology attachment (SATA) protocol, a parallel-ATA (PATA) protocol, a small computer small interface (SCSI) protocol, an enhanced small disk interface (ESDI) protocol, and an integrated drive electronics (IDE) protocol. The host 2000 may be implemented together with the SSD controller 1100 as a System-on-Chip (SoC) or application processor including a central processing unit (CPU) and/or a graphics processing unit (GPU).

The SSD 1000 may include an SSD controller 1100 and/or a plurality of non-volatile memory devices (e.g., 1200 and 1300). The SSD controller 1100 may include neural network processing circuitry 1110.

The neural network processing circuitry 1110 may generate a neural network, train (or learn) the neural network, perform an arithmetic operation of a neural network based on received input data, generate an information signal based on a result of the arithmetic operation of the neural network, and/or retrain the neural network. The neural network processing circuitry 1110 may include at least one processor configured to perform arithmetic operations according to models of the neural network. The neural network processing circuitry 1110 may be otherwise referred to as a neural network processing device, neural network integrated circuitry (IC), or a neural network processing unit (NPU).

The neural network processing circuitry 1110 may receive various kinds of input data and/or may generate an information signal based on the input data. In some example embodiments, the input data received by the neural network processing circuitry 1110 may be arithmetic result data received from the non-volatile memory device 1300 including the arithmetic circuitry 1310.

The neural network processing circuitry 1110 may cause arithmetic circuitry 140 to perform an arithmetic operation of a neural network on input data. For example, the neural network processing circuitry 1110 may generate an information signal that causes the arithmetic circuitry 140 to perform the arithmetic operation of the neural network on the arithmetic input data and the arithmetic internal data. In some example embodiments, the arithmetic operation of the neural network may include a convolution operation. The information signal generated by the neural network processing circuitry 1110 may include at least one of various kinds of recognition signals, such as a speech recognition signal, an object recognition signal, an image recognition signal, and/or a biological information recognition signal. For example, the neural network processing circuitry 1110 may receive frame data included in a video stream as input data and/or may generate a recognition signal for an object included in an image represented by the frame data based on the frame data. However, some example embodiments of some inventive concepts may not be limited thereto. For example, the neural network processing circuitry 1110 may receive various kinds of input data and/or may generate a recognition signal according to the input data.

Some non-volatile memory devices (e.g., 1300) of the plurality of non-volatile memory devices (e.g., 1200 and 1300) included in the SSD 1000 may be the non-volatile memory device 1300 including the arithmetic circuitry 1310, which may be implemented with reference to some example embodiments, including the examples shown in FIGS. 1 to 14.

In some example embodiments, the term "circuitry" and various components (including, without limitation, memory devices such as the non-volatile memory 100; the row decoder circuitry 130; the arithmetic circuitry 140, 1310; the computing circuit 141; the control logic circuitry 150, 150a; the I/O circuitry 160; the counting circuitry 170a; the memory controller 200; and/or the neural network processing circuitry 1110) may include one or more forms of processing circuitry, for example, logic circuits; a hardware/software combination, such as a processor executing software; or a combination thereof. In some example embodiments, the term "circuitry" and such various components may include, without limitation, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. According to some example embodiments, the term "circuitry" and such various components may be implemented as hardware and/or software. For example, when the computing circuitry 141 is implemented as hardware, the computing circuitry 141 may include circuits configured to perform an arithmetic operation of a neural network. As another example, when the computing circuitry 141 is implemented as software, programs (or instructions) and/or I/O code stored in the non-volatile memory device 100 may be executed by the computing circuitry 141 or at least one processor included in the non-volatile memory device 100 to perform the arithmetic operation of a neural network. However, some example embodiments of some inventive concepts may not be limited to the above-described example embodiments. For example, the term "circuitry" and such various components may be implemented as a combination of software and hardware, such as firmware in which instructions are written to a read-only memory, write-once-read-many (WORM) memory, an erasable programmable read-only memory (EPROM), an electrically erasable programmable read-only memory (EEPROM), etc. All such interpretations that are reasonably and logically possible, and that are not contradictory with other statements, are intended to be included in this disclosure, the scope of which is to be understood as being limited only by the claims.

Some example embodiments of some inventive concepts are disclosed in the above description and the drawings. Although specific terms are employed, they are used in a generic and descriptive sense only and not for purposes of limitation. It will be understood by those of ordinary skill in the art that various changes in form and details may be made to the disclosed examples without departing from the spirit and scope of some example embodiments of some inventive concepts as defined by the following claims.

As used herein, terms such as "when" and "while" may, but are not necessarily intended to, imply a chronological relationship such as a sequence of events. For example, operations that are described as occurring "when" or "while" a condition is fulfilled may be performed concurrently with the fulfillment of the condition, or during the fulfillment of the condition, or after the fulfillment of the condition, or because the condition is fulfilled or has been fulfilled, etc. Similarly, phrases such as "on condition of" that associate an operation with a condition may indicate that the operation is performed concurrently with the fulfillment of the condition, or during the fulfillment of the condition, or after the fulfillment of the condition, or because the condition is fulfilled or has been fulfilled, etc. As used herein, "simultaneous" and "in parallel" may refer to two or more operations, activities, and/or events that occur at the same time, and/or two or more operations, activities, and/or events that occur contemporaneously and/or concurrently (e.g., in an at least partially overlapping and/or interleaved manner). All such interpretations that are reasonably and logically possible, and that are not contradictory with other statements, are intended to be included in this disclosure, the scope of which is to be understood as being limited only by the claims.

Each of the flowcharts presented and discussed herein depicts a set of operations that are arranged in a certain order. However, it is to be appreciated that the arrangement of the operations in each flowchart depicts only one example, and that operations may be added, removed, reordered, and/or performed concurrently in accordance with the subject matter of the present disclosure. For example, FIG. 3 includes an operation S110 of receiving an arithmetic command followed by an operation S120 of reading arithmetic data and an operation S130 of receiving arithmetic input. However, in some example embodiments, operation S110 may occur concurrently with and/or after one or both of S120 and/or S130. All such variations that are reasonably and logically possible, and that are not contradictory with other statements, are intended to be included in this disclosure, the scope of which is to be understood as being limited only by the claims.

What is claimed is:

1. A non-volatile memory device comprising:
a memory cell array to which an arithmetic internal data is written; and arithmetic circuitry configured to,
receive an arithmetic input data and the arithmetic internal data for an arithmetic operation of a neural network with the arithmetic internal data and the arithmetic input data in response to an arithmetic command, wherein the arithmetic internal data includes a first arithmetic internal data that is written to a first page of the memory cell array and is used as an operand of a first arithmetic operation of the neural network, and a second arithmetic internal data that is written to a second page of the memory cell array and is used as an operand of a second arithmetic operation of the neural network,
perform the arithmetic operation of the neural network using the arithmetic internal data and the arithmetic input data to generate an arithmetic result data, and
output the arithmetic result data of the arithmetic operation of the neural network, wherein the non-volatile memory device is configured to (i) receive an arithmetic information signal including a first address, and (ii) sequentially read the first arithmetic internal data and the second arithmetic internal data in response to the arithmetic command and the arithmetic information signal.

2. The non-volatile memory device of claim 1, wherein the arithmetic circuitry includes,
computing circuitry configured to perform the arithmetic operation and generate the arithmetic result data; and
a buffer configured to store the arithmetic result data.

3. The non-volatile memory device of claim 2, wherein the buffer is configured to output the arithmetic result data on condition of receiving a second arithmetic input data for the second arithmetic operation of the neural network.

4. The non-volatile memory device of claim 1, wherein the arithmetic information signal includes a second address indicating the second page.

5. The non-volatile memory device of claim 1, wherein the arithmetic information signal includes a number of pages to be read for the arithmetic operation of the neural network.

6. The non-volatile memory device of claim 1, wherein the arithmetic circuitry is further configured to perform the arithmetic operation in parallel with receiving of a second arithmetic input data for the second arithmetic operation of the neural network.

7. The non-volatile memory device of claim 1, wherein the arithmetic circuitry is further configured to perform the arithmetic operation in parallel with reading of the second arithmetic internal data for the second arithmetic operation of the neural network.

8. The non-volatile memory device of claim 1, wherein the arithmetic circuitry includes multiplication and accumulation circuitry configured to perform a multiplication operation and an accumulation operation of the neural network using the arithmetic internal data and the arithmetic input data.

9. The non-volatile memory device of claim 8, wherein the multiplication and accumulation circuitry includes,
a multiplier configured to multiply the arithmetic internal data by the arithmetic input data and generate multiplication data;
a register configured to temporarily store arithmetic data; and
an adder configured to store, in the register, a sum of the multiplication data and the arithmetic data.

10. A non-volatile memory device comprising:
a memory cell array to which arithmetic internal data is written;
arithmetic circuitry configured to perform an arithmetic operation using a plurality of operands to generate an arithmetic result data;
control logic circuitry configured to,
receive an arithmetic command for the arithmetic operation for processing a neural network,
read the arithmetic internal data written to the memory cell array in response to the arithmetic command,
generate an arithmetic control signal that causes the arithmetic circuitry to perform the arithmetic operation for processing the neural network using the plurality of operands including the arithmetic internal data and an arithmetic input data, wherein the control logic circuitry generates the arithmetic control signal on condition of a size of the arithmetic internal data corresponding to a size of the arithmetic input data, and output the arithmetic result data of the arithmetic operation of the neural networks; and counting circuitry configured to count a clock signal while the non-volatile memory device receives the arithmetic input data, wherein the control logic circuitry generates the arithmetic control signal based on a counting result of the counting circuitry.

11. The non-volatile memory device of claim 10, wherein the arithmetic circuitry includes, computing circuitry configured to perform the arithmetic operation of the neural network and generate the arithmetic result data, and a buffer configured to temporarily store the arithmetic result data and output the arithmetic result data in response to the arithmetic control signal.

12. The non-volatile memory device of claim 10, wherein the arithmetic circuitry is further configured to perform the arithmetic operation of the neural network in parallel with the non-volatile memory device receiving a second arithmetic input data for a next arithmetic operation of the neural network.

13. The non-volatile memory device of claim 10, wherein the arithmetic circuitry is further configured to perform the arithmetic operation of the neural network in parallel with the memory cell array transmitting the arithmetic internal data for a next arithmetic operation of the neural network to the arithmetic circuitry.

14. A neural network system configured to perform an arithmetic operation of a neural network, the neural network system comprising:

a memory controller configured to generate an arithmetic command to perform the arithmetic operation, and transmit the arithmetic command and an arithmetic input data; and a memory device configured to, receive the arithmetic command and the arithmetic input data, read an arithmetic internal data written to a memory cell array in response to the arithmetic command, generate an arithmetic control signal on condition of a size of the arithmetic internal data corresponding to a size of the arithmetic input data, perform, in response to the arithmetic control signal, the arithmetic operation using the arithmetic input data and arithmetic internal data, and output an arithmetic result data of the arithmetic operation of the neural network, wherein the memory device comprises counting circuitry configured to count a clock signal while the memory device receives the arithmetic input data, and wherein the memory device is configured to generate the arithmetic control signal based on a counting result of the counting circuitry.

15. The neural network system of claim 14, wherein the memory device is a solid-state drive (SSD).

16. The neural network system of claim 14, wherein the memory device performs the output by transmitting the arithmetic result data to the memory controller.

17. The neural network system of claim 14, wherein the memory device further comprises:

computing circuitry configured to perform the arithmetic operation of the neural network and generate the arithmetic result data; and a buffer configured to store the arithmetic result data.

* * * * *